United States Patent [19]
Miller et al.

[11] Patent Number: 6,026,219
[45] Date of Patent: *Feb. 15, 2000

[54] BEHAVIORAL SYNTHESIS LINKS TO LOGIC SYNTHESIS

[75] Inventors: Ronald A. Miller, Mountain View; Donald B. MacMillen, Redwood Shores; Tai A. Ly, San Jose; David W. Knapp, Palo Alto, all of Calif.

[73] Assignee: Synopsys, Inc., Mountain View, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/440,101

[22] Filed: May 12, 1995

[51] Int. Cl.[7] .................................................. G06F 19/00

[52] U.S. Cl. .......................... 395/500; 364/578; 364/488; 364/489; 364/490; 364/491

[58] Field of Search ..................................... 364/488–491, 364/578; 395/500

[56] References Cited

U.S. PATENT DOCUMENTS

| | | | |
|---|---|---|---|
| 4,703,435 | 10/1987 | Darringer et al. | 364/489 |
| 4,827,427 | 5/1989 | Hyduke | 364/489 |
| 4,882,690 | 11/1989 | Shinsha et al. | 364/490 |
| 5,029,102 | 7/1991 | Drumm et al. | 364/489 |
| 5,095,441 | 3/1992 | Hooper et al. | 364/489 |
| 5,111,413 | 5/1992 | Lazansky et al. | 364/578 |
| 5,128,871 | 7/1992 | Schmitz | 364/490 |
| 5,150,308 | 9/1992 | Hooper et al. | 364/489 |
| 5,151,867 | 9/1992 | Hooper et al. | 364/489 |
| 5,168,455 | 12/1992 | Hooper | 364/489 |
| 5,175,843 | 12/1992 | Casavant et al. | 395/500 |
| 5,222,029 | 6/1993 | Hooper et al. | 364/489 |
| 5,237,513 | 8/1993 | Kaplan | 364/490 |
| 5,359,537 | 10/1994 | Saucier et al. | 364/489 |
| 5,377,122 | 12/1994 | Werner et al. | 364/488 |
| 5,426,591 | 6/1995 | Ginetti et al. | 364/489 |
| 5,519,627 | 5/1996 | Mahmood et al. | 364/488 |
| 5,544,066 | 8/1996 | Rostoker et al. | 364/489 |
| 5,684,709 | 11/1997 | Stoll . | |

OTHER PUBLICATIONS

Kuehlmann, A. et al. "Timing Analysis in High–Level Synthesis," Proceedings of the IEEE/ACM International Conference on Computer AI Design (ICCAD), Santa Clara, CA., Nov. 8–12, 1992, pp. 349–354.

Gajski, D.D. et al. "Introduction to High–Level Synthesis," IEEE Design & Test of Computers, vol. 11, No. 4, Dec. 21, 1994, pp. 44–54.

Baldwin, D. et al. "Constraint Sensitive Scheduling in RASP, "SIGDA Newsletter, vol. 21, No. 2, Oct. 1, 1991, pp. 50–59.

Narayan, S. et al. "System Clock Estimation Based on Clock Stack Minimization," Proceedings of the European Design Automation Conference (EURO–DAC), Hamburg, Sep. 7–10, 1992, pp. 66–71.

Camposano, R. "Path–Based Scheduling for Synthesis," IEEE Transactions on Computer Aided Design of Integrated Circuits and Systems, vol. 10, No. 1, Jan. 1, 1991, pp. 85–93.

Raul Camposano, "Design Process Model in the Yorktown Silicon Compiler," Proceedings of the 25th ACM/IEEE Design Automation Conference, 1988, pp. 489–494.

Brian Ebert et al., "SeeSaw: A Verilog Synthesis Viewer," 2nd Annual International Verilog HDL Conference. Design Excellence for Today and Tomorrow; Santa Clara, CA, Mar. 2, 1993, pp. 55–60.

(List continued on next page.)

Primary Examiner—Kevin J. Teska
Assistant Examiner—Lonnie A. Knox
Attorney, Agent, or Firm—McDermott, Will & Emery

[57] ABSTRACT

A method and an apparatus for coupling the results of behavioral synthesis with those of logic synthesis. It uses a timing verifier to precalculate the timing characteristics of a circuit for use by behavioral synthesis. Timing for control chaining is included in the precalculated timing characteristics. Once behavioral synthesis is complete, logic synthesis is informed of timing constraints introduced by behavioral synthesis.

32 Claims, 20 Drawing Sheets-

OTHER PUBLICATIONS

Milind Girkar et al., "Optimization of Data/Control Conditions in Task Graphs," publication date unknown, pp. 1–15.

Brent Gregory et al., "ISIS: A System for Performance Driven Resource Sharing," Proceedings of the 29th ACM/IEEE Design Automation Conference, Jun. 1992, pp. 285–290.

Michael C. McFarland et al., "The High–Level Synthesis of Digital Systems," Proceedings of the IEEE, vol. 78, No. 2, Feb. 1990, pp. 301–318.

Monica Sin–Ling Lam, "A Systolic Array Optimizing Compiler," May 1987, pp. 1–138.

Leon Stok, "False Loops through Resource Sharing," IEEE, 1992, pp. 345–348.

```
module foo ( a, b, c, x, y, r);

input [1:0] a, b, c, x, y;
    output [2:0] r;
    reg [2:0] r;

always begin if ( x < y )
            r <= a + b - c;
        else
            r <= b + c;

end endmodule
```

Figure 4

Timing Verifier Method for Calculating
Control Chaining Continued

Method for Finding Driving Data Operations

BEHAVIORAL SYNTHESIS LINKS TO LOGIC SYNTHESIS

RELATED APPLICATION

This application is related to U.S. patent application Ser. No. 08/440,554 entitled "Methods for Automatically Pipelining Loops" with inventors Tai A. Ly, David W. Knapp, Ronald A. Miller, and Donald B. MacMillen filed on May 12, 1995, which is hereby incorporated by reference.

BACKGROUND

1. Field of the Invention

This invention relates to the field of computer aided design for digital circuits, particularly to linking results from a logic synthesis system to a behavioral synthesis system.

2. Statement of the Related Art

Behavioral Synthesis
Behavioral vs. Register Transfer Level Design

Many of today's integrated circuits are described using a Hardware Description Language (HDL). Two common HDL's are VHDL and Verilog. VHDL is described in the IEEE Standard VHDL Language Reference Manual available from the Institute of Electrical and Electronic Engineers in Piscataway, N.J. which is hereby incorporated by reference. Verilog is described in *The Verilog Hardware Description Language* by Donald E. Thomas and Philip Moorby, Kluwer Academic Publishers, 1991 which is hereby incorporated by reference.

As integrated circuits become increasingly complex, hardware designers are increasingly using synthesis software to transform HDL descriptions of digital circuits into mapped logic. The designer writes a description of a digital circuit in VHDL, Verilog, or another HDL, and uses synthesis software to create a digital circuit from the description. Using synthesis software typically shortens the amount of time required create a digital circuit from a design specification, and allows a designer to create more complex designs than is possible manually.

Many of today's complex designs are expressed as software descriptions and simulated to verify their correctness. These designs are later translated from software into hardware, in the form of Integrated Circuits (ICs), Application Specific Integrated Circuits (ASICs), or Field Programmable Gate Arrays (FPGAs), for implementation in the final product. This design description methodology is called algorithmic-level design.

Instead of beginning design at the Register Transfer Level (RTL), behavioral synthesis begins at the algorithmic (behavioral) level. RTL level design is described in *Computer Structures: Reading and Examples* by C. Gorden Bell and Allen Newell, McGraw-Hill 1971. A behavioral hardware description language (HDL) specification contains instructions, operations, variables, and arrays similar to the original software algorithm.

The target architecture of behavioral synthesis is a general computing model that contains datapath, memory, and control elements. Conventional design techniques currently use a manual RTL design methodology to build a datapath. A datapath is a sequence of logic consisting of registers, higher order functional units (such as adders and multipliers), and multiplexers. The datapath in a digital circuit uses the circuit's inputs to compute output results. Registers are 1-bit memory elements which hold their value through each clock cycle.

Conventional design techniques also build a controller at the RTL to sequence and control the actions of the datapath, memory, and Input/Output (I/O). Frequently, such controllers are implemented using a Finite State Machine (FSM). Finite state machines are described in *Switching and Finite Automata Theory* by Zvi Kohavi, Computer Science Press, 1978 which is hereby incorporated by reference. Controllers may also determine actions such as which branch of a conditional statement is executed.

Behavioral synthesis builds this architecture by using automated methods of scheduling, allocation, register sharing, memory and control inferencing—all of which are performed manually in an RTL methodology. The designer is freed from having to specify the exact architecture of a design and can automatically explore many implementations to find the optimal architecture.

Components of Behavioral Synthesis

*The High-Level Synthesis of Digital Systems* by Michael McFarland, Alice Parker, and Raul Camposano, in Proceedings of the IEEE, February 1990, which is hereby incorporated by reference, provides an excellent overview of High Level Synthesis, as Behavioral Synthesis is often called.

Three components of a behavioral synthesis system are Scheduling, Allocation, and Resource Sharing.

Scheduling determines in which clock cycle each operation executes. Scheduling extracts the control and data flow operations of a design specification and assigns these operations to cycles. A state machine controller is synthesized to sequence the operations and execute them in their assigned cycle. The typical goal of this process is to assign operations to cycles so as to be able to implement the design with the fewest resources (registers, multiplexers, and operations) while at the same time minimizing the number of clock cycles (latency).

Allocation is a behavioral synthesis task that maps the operations and data of a behavioral HDL specification into the datapath, which contains memories, registers, functional units such as adders and multiplexers, and gates. Allocation determines which type of operation to use for each operator. For instance, if an operator performs addition, a ripple carry, a carry-lookahead, or some other type of adder can be used.

Resource Sharing attempts to share hardware resources between operators in a design. For example, consider two additions which occur in mutually exclusive conditional branches. Such additions will never be performed at the same time. Thus, they can be performed on the same piece of hardware. Resource sharing attempts to minimize the amount of hardware used by sharing hardware as much as possible.

Estimating Delays

Behavioral transformations such as scheduling require delay information. Conventional behavioral synthesis systems use estimates for operation delays. Two common methods are use of unit delays for operations, and use of an operation library which contains timing information. Systems which use unit operation delays assume that an operation will require a unit amount of time to complete. For instance, a ripple carry adder is assumed to have a delay of 5. This method is used in many systems to estimate delays for actual elements. It is simple to implement, and does not require actual timing measurements on the circuit. However, this method does not provide accurate timing estimates for real circuits.

Timing information in operation libraries is more accurate than unit delays. Operation libraries typically contain different types of operations with different bit widths. Each operation in the library contains timing information which has been generated by a timing verifier. The timing information for each operation is reasonably accurate for that bit width of that particular type of operation. Due to computer storage requirements, operation libraries do not include every possible type of operation in every possible bit width. Systems which use operation libraries must interpolate or extrapolate when the correct operation in the correct bit width is not available. Furthermore, operation libraries do not include chained timing information. Chained timing information gives the total delay for two or more serially connected operations. Operation libraries also lack timing information for control chaining as well as for combinational logic that can also be serially connected to operations.

Control Chaining

When neither the inputs nor the outputs of a control FSM are registered, the control FSM can possibly use a datapath result to generate a control signal that controls some other action of the datapath all within a single cycle. For example, a controller may need to generate a signal to drive a multiplexer that controls which branch of a conditional is executed. The control signal must be generated before the operations driven by the multiplexer can execute. If the clock cycle is sufficiently long, the control signal can be generated, and then the datapath operation(s) can be executed in the same clock cycle. This is called control chaining since the calculation of the control signals has been chained into the same cycle as datapath operations.

Multicycle Constraints

Some operations, such as large multipliers, may require multiple cycles to create valid outputs. Such operations are called multicycle operations. When the datapath is manually specified at the RTL level, the designer must specify all of the multicycle paths in the design to the logic synthesis system. This specification is necessary so that the logic synthesizer does not try to optimize the multicycle paths so that they can execute in a single cycle.

Because each possible path must be enumerated, manual specification of multicycle constraints is tedious and error prone. For example, consider a 32 bit by 32 bit multiplier. Such a multiplier produces 64 bits of output. There are (32+32)*64=4096 possible paths through this multiplier. Each of these paths must be individually annotated to ensure that logic synthesis performs properly.

SUMMARY OF THE INVENTION

An aspect of the present invention provides an apparatus and a method for computing the ready times of operations in a circuit using a timing verifier. The circuit is mapped to a target technology and a conventional timing verifier is used to time the circuit. The ready times of the operators in the circuit are stored in chaining tables. The delay information in the chaining tables can be used by scheduling to determine which operations can be chained into a single cycle.

Another aspect of the present invention provides an apparatus and a method for computing the effects of chaining operations on the datapath with operations on the control path in the same clock cycle. Delay information for operations on the data path is annotated onto the chaining tables for operations on the control path. This delay information can be used for control chaining in scheduling.

Another aspect of the present invention provides an apparatus and a method for post annotating multicycle constraints. Each path through each multicycle operation which is instantiated in the design by behavioral synthesis is annotated as a multicycle path. Such annotations allow the logic optimizer to correctly optimize multicycle operations.

A BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 4 shows an example of a Verilog HDL code fragment.

Figure 5:
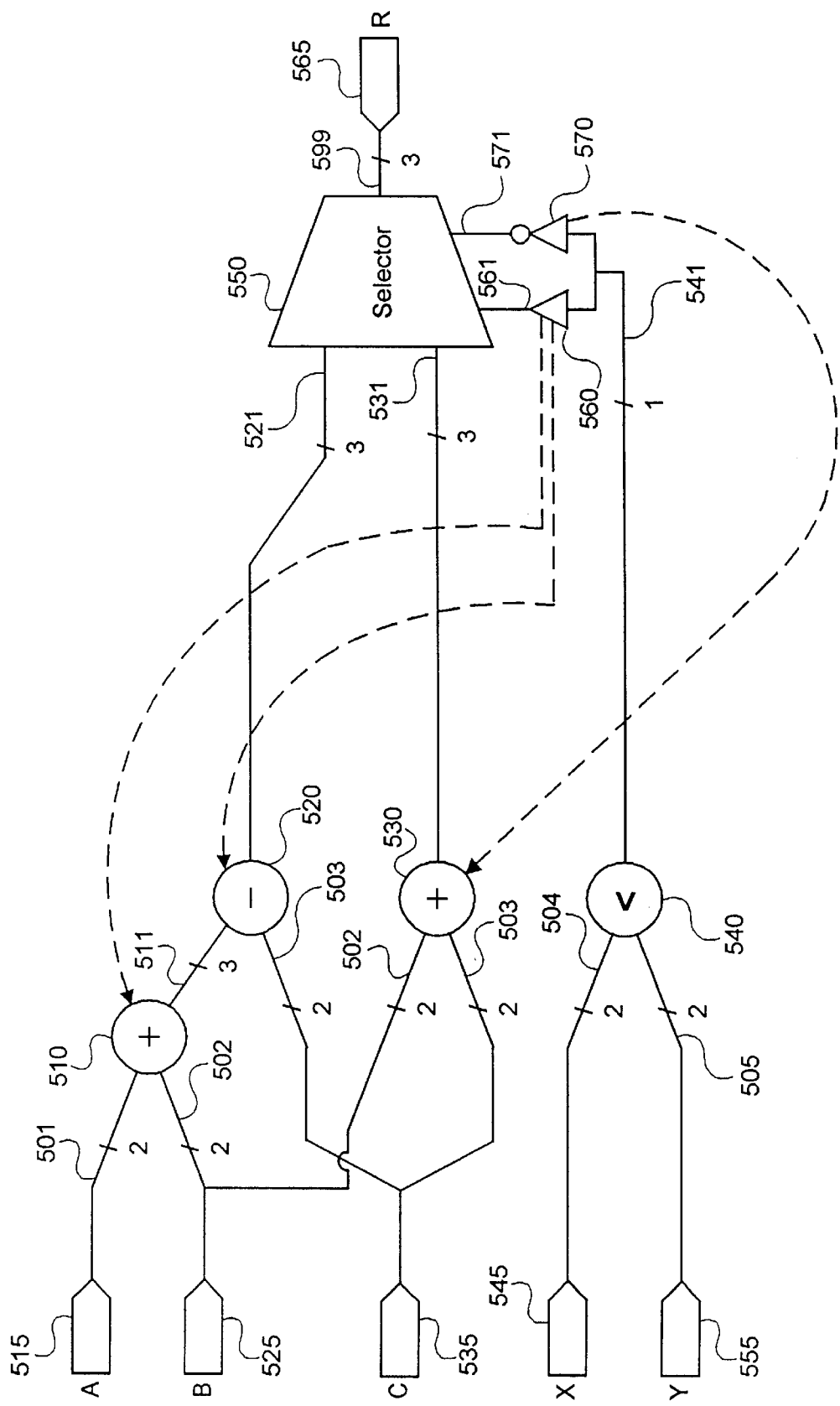
FIG. 5 shows a representation of a circuit stored in memory which is created from the Verilog HDL source code fragment shown in FIG. 4.
Figure 15A:
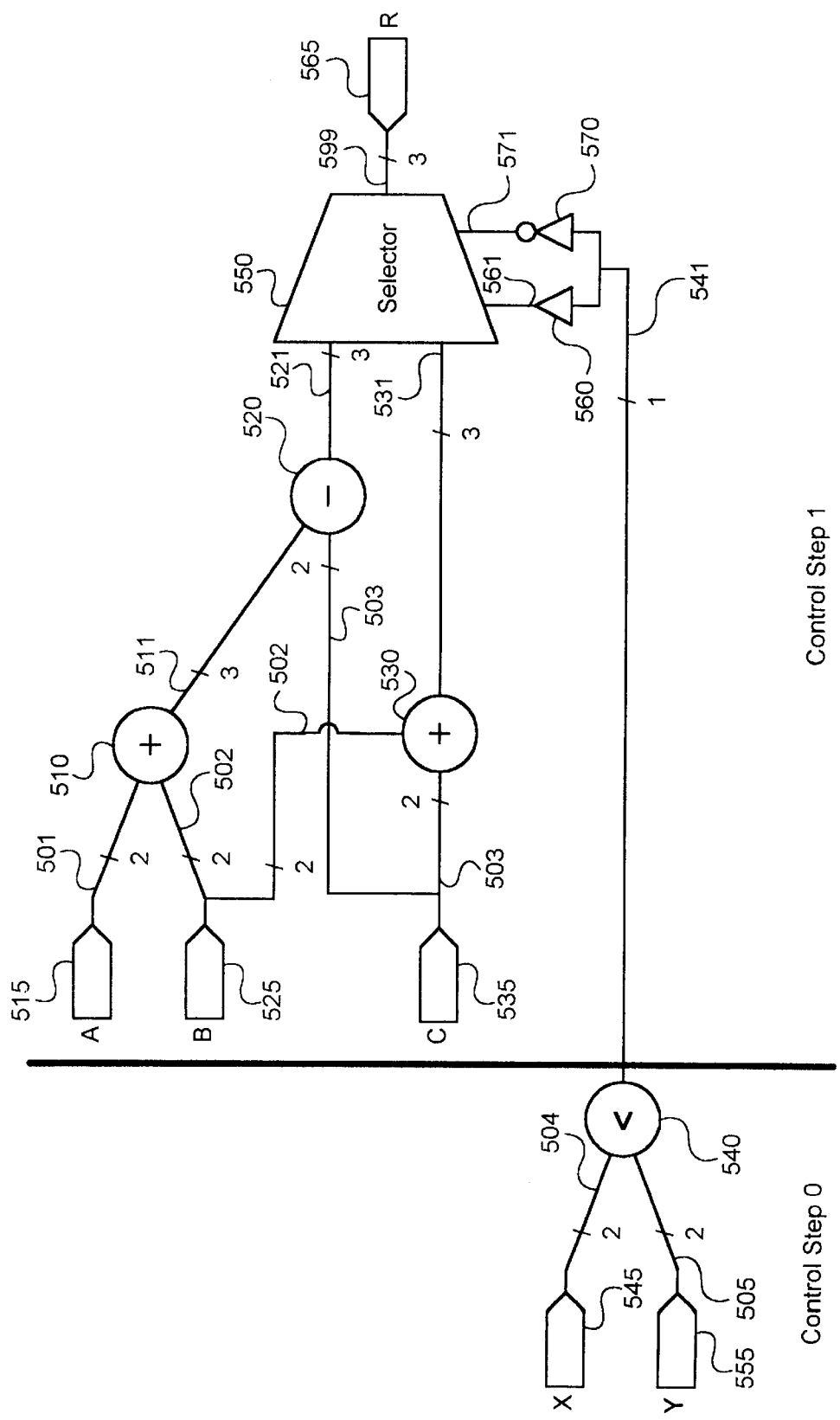
Figure 15B:
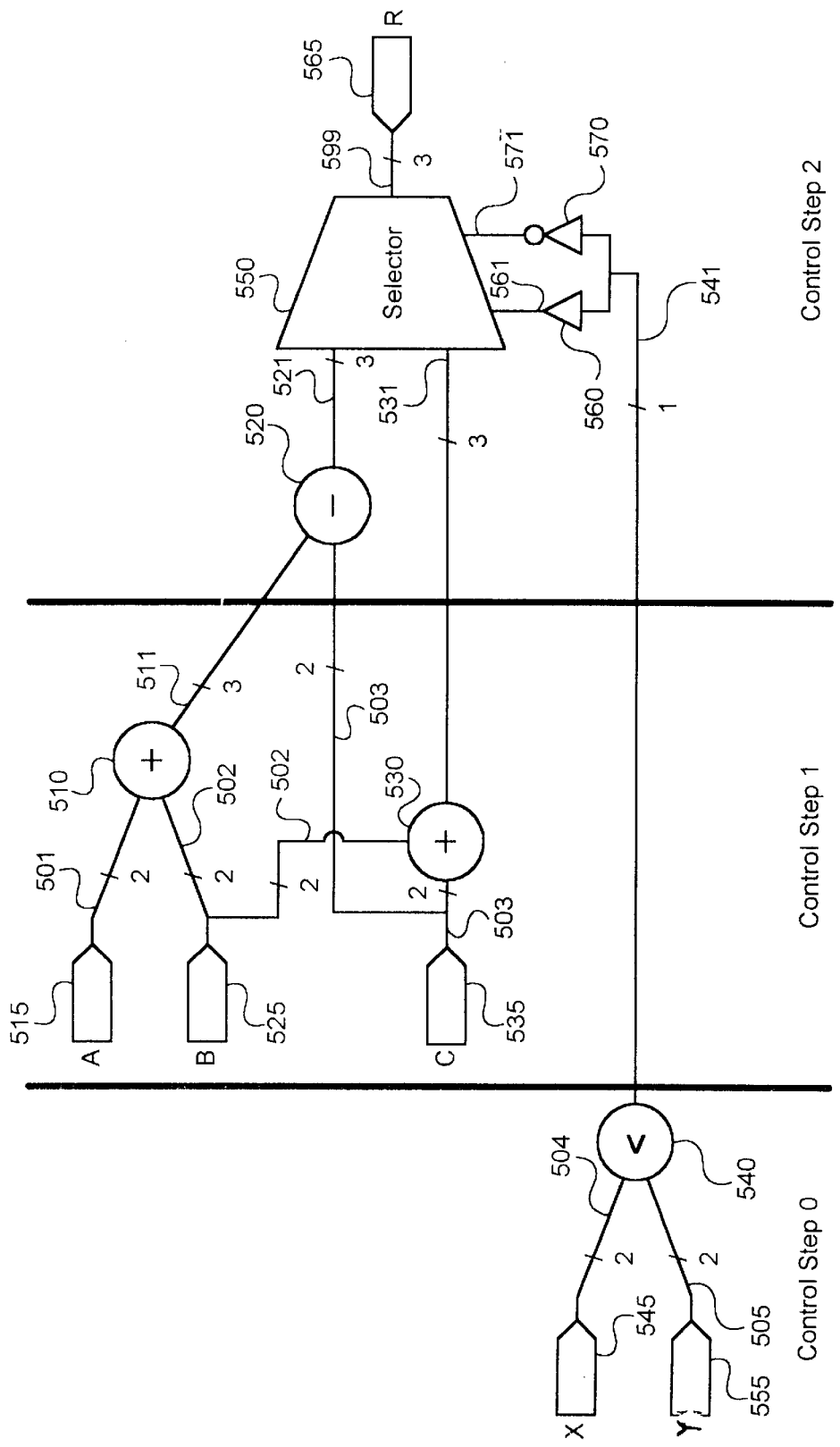

FIG. 15 (*a*) and FIG. 15 (*b*) show the circuit representation of FIG. 5 with the operations scheduled given a clock period of 10.

Figure 16:
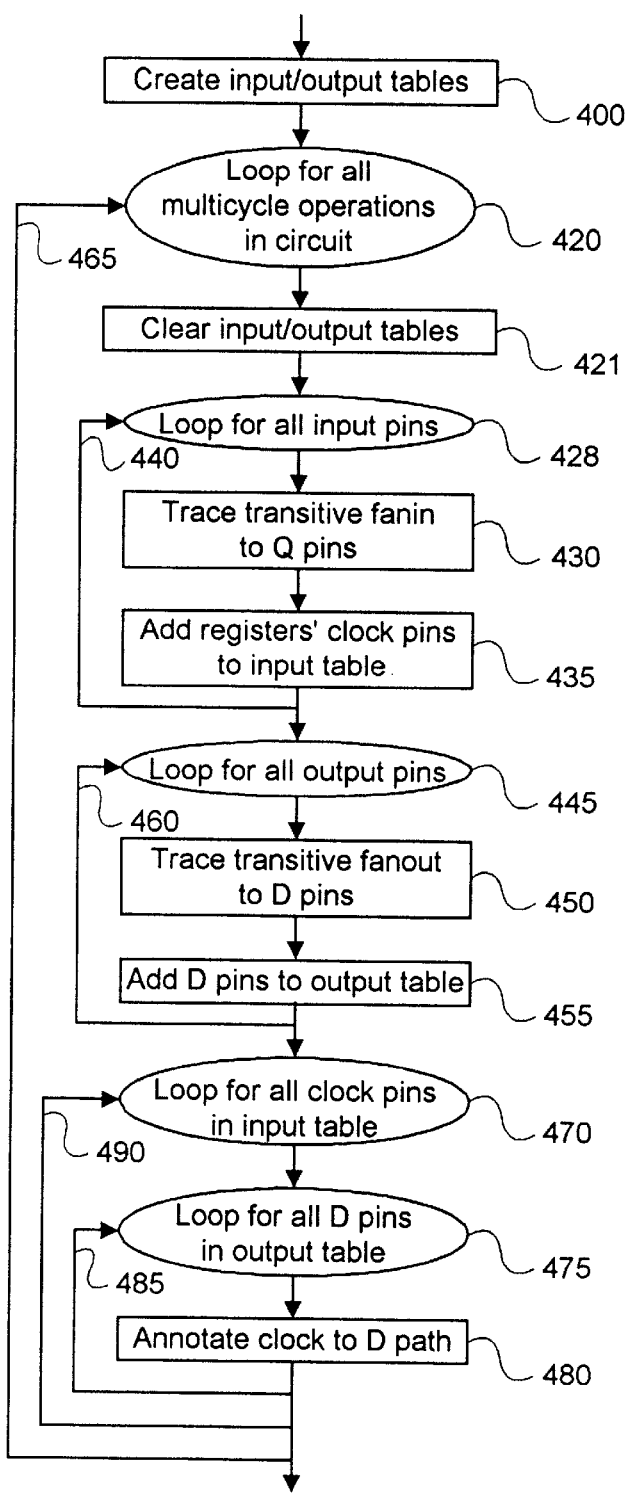

FIG. 16 is a flowchart showing steps for postannotating multicycle paths in a GTech circuit.

Figure 17:
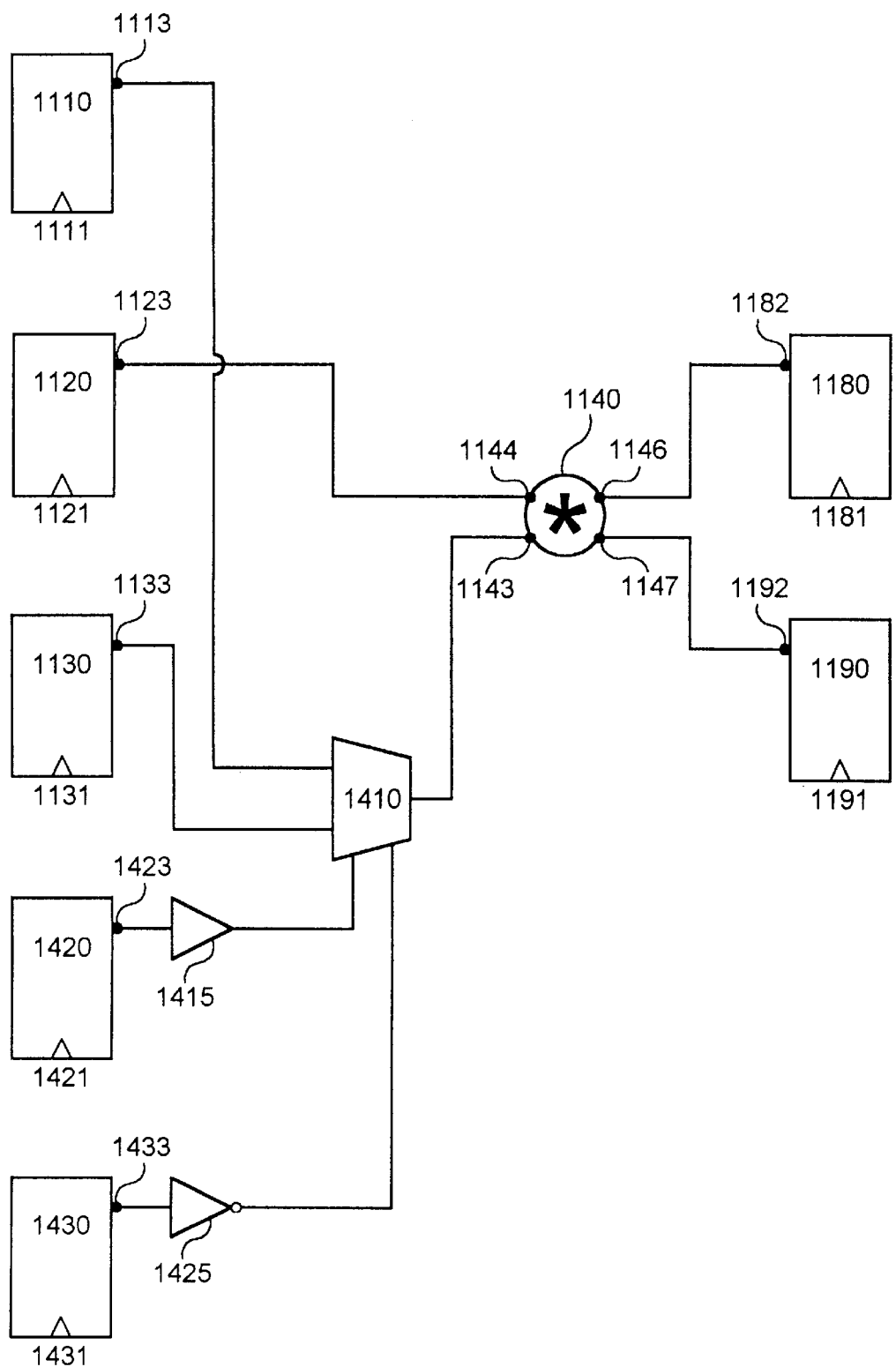

FIG. 17 shows a representation of a portion of a circuit stored in memory which has its clusters implemented.

Figure 18:
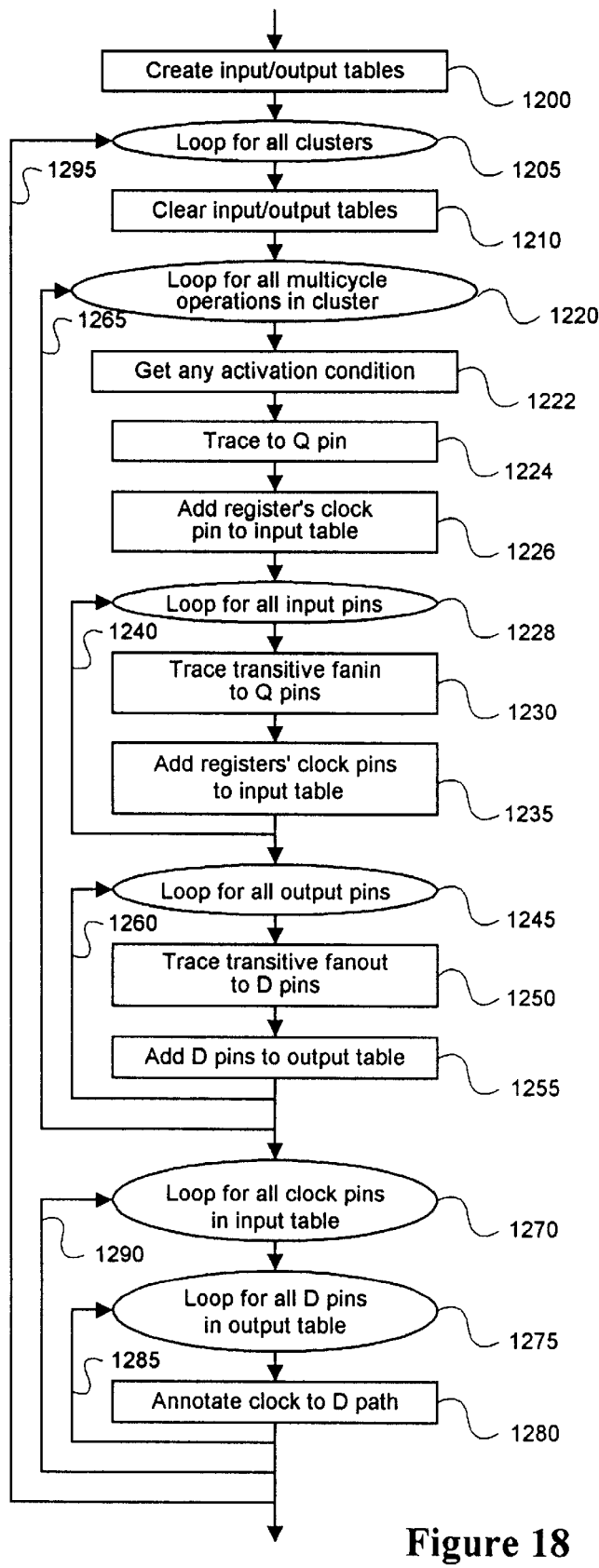

FIG. 18 is a flowchart showing alternate steps for post-annotating multicycle paths in a GTech circuit.

Figure 19:
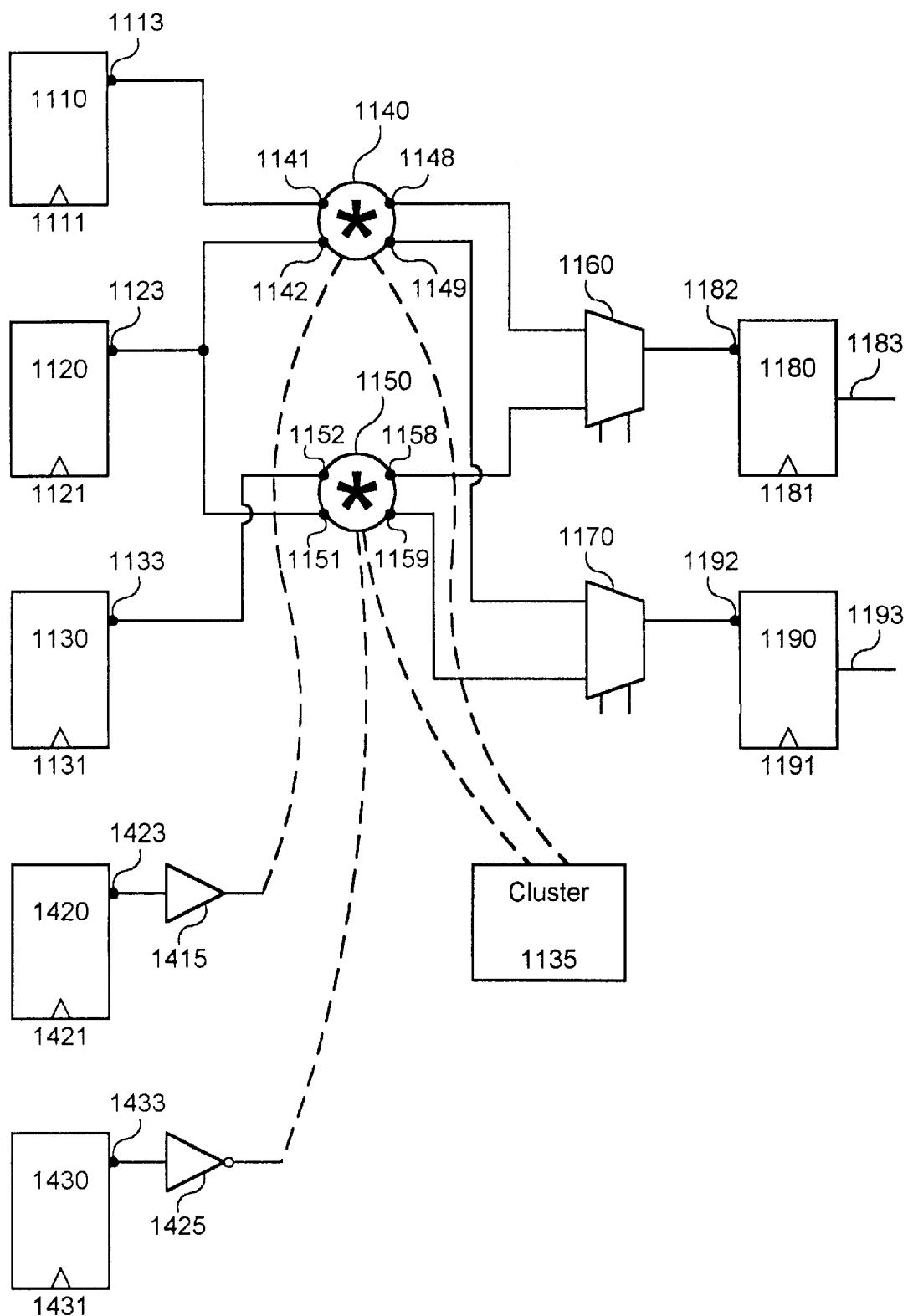

FIG. 19 shows a representation of a portion of a circuit stored in memory before its clusters are implemented.

DETAILED DESCRIPTION OF THE INVENTION

The present invention comprises a novel apparatus and method for analyzing a digital circuit using the HDL source description from which the digital circuit was created. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

1.0 Computer System Description

Figure 1:
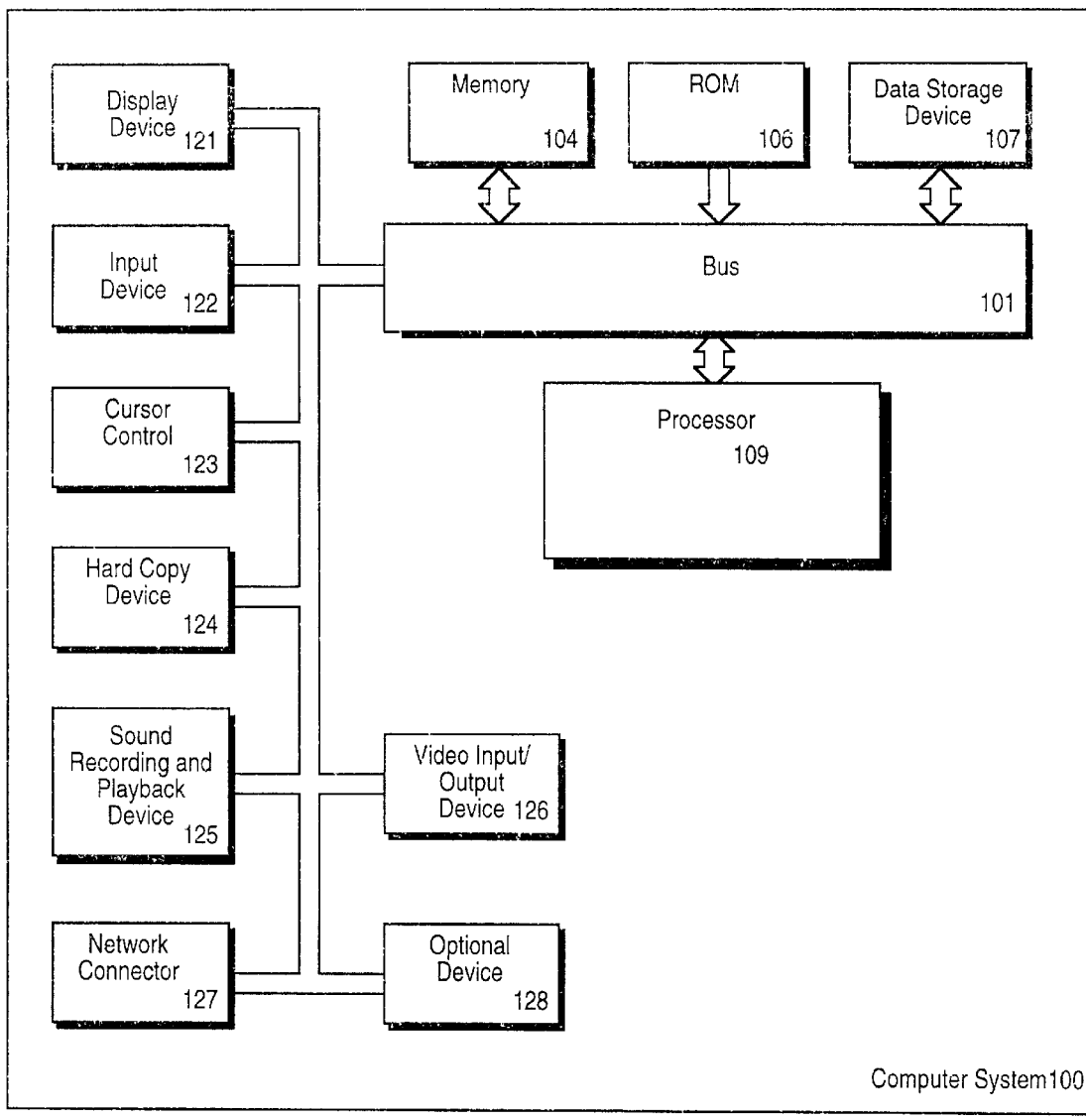
FIG. 1 is a block diagram showing a computer system.

FIG. 1 illustrates a computer system 100 in accordance with a preferred embodiment of the present invention. The computer system 100 includes a bus 101, or other communications hardware and software, for communicating information, and a processor 109, coupled with the bus 101, is for processing information. The processor 109 can be a single processor or a number of individual processors that can work together. The computer system 100 further includes a memory 104. The memory 104 can be random access memory (RAM), or some other dynamic storage device. The memory 104 is coupled to the bus 101 and is for storing information and instructions to be executed by the processor 109. The memory 104 also may be used for storing temporary variables or other intermediate information during the execution of instructions by the processor 109. The computer system 100 also includes a ROM 106 (read only memory), and/or some other static storage device, coupled to the bus 101. The ROM 106 is for storing static information such as instructions or data.

The computer system 100 can optionally include a data storage device 107, such as a magnetic disk, a digital tape system, or an optical disk and a corresponding disk drive. The data storage device 107 can be coupled to the bus 101.

The computer system 100 can also include a display device 121 for displaying information to a user. The display device 121 can be coupled to the bus 101. The display device 121 can include a frame buffer, specialized graphics rendering devices, a cathode ray tube (CRT), and/or a flat panel display. The bus 101 can include a separate bus for use by the display device 121 alone.

An input device 122, including alphanumeric and other keys, is typically coupled to the bus 101 for communicating information, such as command selections, to the processor 109 from a user. Another type of user input device is a cursor control 123, such as a mouse, a trackball, a pen, a touch screen, a touch pad, a digital tablet, or cursor direction keys, for communicating direction information to the processor 109, and for controlling the cursor's movement on the display device 121. The cursor control 123 typically has two degrees of freedom, a first axis (e.g., x) and a second axis (e.g., y), which allows the cursor control 123 to specify positions in a plane. However, the computer system 100 is not limited to input devices with only two degrees of freedom.

Another device which may be optionally coupled to the bus 101 is a hard copy device 124 which may be used for printing instructions, data, or other information, on a medium such as paper, film, slides, or other types of media.

A sound recording and/or playback device 125 can optionally be coupled to the bus 101. For example, the sound recording and/or playback device 125 can include an audio digitizer coupled to a microphone for recording sounds. Further, the sound recording and/or playback device 125 may include speakers which are coupled to digital to analog (D/A) converter and an amplifier for playing back sounds.

A video input/output device 126 can optionally be coupled to the bus 101. The video input/output device 126 can be used to digitize video images from, for example, a television signal, a video cassette recorder, and/or a video camera. The video input/output device 126 can include a scanner for scanning printed images. The video input/output device 126 can generate a video signal for, for example, display by a television.

Also, the computer system 100 can be part of a computer network (for example, a LAN) using an optional network connector 127, being coupled to the bus 101. In one embodiment of the invention, an entire network can then also be considered to be part of the computer system 100.

An optional device 128 can optionally be coupled to the bus 101. The optional device 128 can include, for example, a PCMCIA card and a PCMCIA adapter. The optional device 128 can further include an optional device such as modem or a wireless network connection.

2.0 Definitions

A digital circuit is an interconnected collection of parts. Parts may also be called cells. The digital circuit receives signals from external sources at points called primary inputs. The digital circuit produces signals for external destinations at points called primary outputs. Primary inputs and primary outputs are also called ports. Each part receives input signals and computes output signals. Each part has one or more pins for receiving input signals and producing output signals. In general, pins have a direction. Most pins are either input pins, which are called loads, or output pins, which are called drivers. Some pins may be bidirectional pins, which can be both drivers and loads.

Two or more pins from one or more parts or primary inputs or primary outputs are connected together with a net. Each net establishes an electrical connection among the connected pins, and allows the parts to interact electrically with each other. Pins are also connected to primary inputs and primary outputs with nets. For the sake of simplicity, parts may be said to be "connected" to nets, but it is actually pins on the parts which are connected to the nets.

A Circuit Element is any component of a circuit. Ports, pins, nets, and cells are all circuit elements. Any circuit element which is an input to another circuit element is said to drive that circuit element. Any circuit element which is an output of another circuit element is said to load that circuit element. For example, drivers drive a signal onto a net; loads load nets with capacitance.

A digital circuit design can be stored in memory of a computer system using data structures which represent the various components of the circuit. The data structures have the same name as the physical components. In this document, parts, cells, nets, pins, and other digital circuit components refer to the software representation of the physical digital circuit component.

A digital circuit can be specified hierarchically. Some or all of the parts in the digital circuit may themselves be digital circuits composed of more interconnected parts. When a high level part is specified as a digital circuit composed of other, lower level parts, the pins of the high level part become the primary inputs and primary outputs for the digital circuit comprising the lower level parts. When a high level part is composed of lower level parts, it is called a level of hierarchy.

Following are additional definitions of terms which are used in this document.

An HDL is a Hardware Description Language. HDL's are used to describe designs for digital circuits.

A Translated Circuit, Generic Technology Circuit, or GTech Circuit is a software representation of a digital circuit which does not include references to a specific technology, but rather refers to cells that implement generic logic such as "and", "or", and "not". This software representation is stored in memory 104 of computer system 100.

A Mapped Circuit is a software representation of a digital circuit which is built from parts available in a technology library which is provided by a silicon vendor. This software representation is stored in memory 104 of computer system 100. A mapped circuit can be timed using a conventional timing verifier such as DesignTime, available from Synopsys, Inc. in Mountain View, Calif. After it is built, a netlist representation of a mapped circuit can be sent to a silicon vendor for layout and fabrication. For instance, the mapped circuit can be written out using LSI netlist format and sent to LSI Logic in Milpitas, Calif. The process of creating a mapped circuit from a generic technology circuit is called mapping. Because a circuit must be mapped before it can be timed, mapped circuits are also used internally by synthesis tools.

The Fanout of a circuit element includes any circuit elements which are driven by that circuit element. The transitive fanout of a circuit element includes all of the circuit elements in the circuit which are driven, either directly or indirectly, by that circuit element. Thus, the transitive fanout of a circuit element includes the fanout of that circuit element, as well as the fanout of each of the circuit elements in the original fanout, and so on.

The Fanin of a circuit element includes any circuit elements which drive that circuit element. The transitive fanin of a circuit element includes all of the circuit elements in the circuit which drive, either directly or indirectly, that circuit element. Thus, the transitive fanin of a circuit element includes the fanin of that circuit element, as well as the fanin of each of the circuit elements in the original fanin, and so on.

An Operator is a function, such as addition. Such functions are used in HDL source code. For example, the plus in "c=a+b;" is an operator.

An Operation is a software representation of a hardware functional unit which performs a function such as addition. For example, a software representation of an adder is an operation.

A Clock Cycle is a period of time, for example 10 ns, between pulses of a clocking element in a digital circuit. The clocking element is used to synchronize the digital circuit.

A Ready Time is the time at which a signal value is stable and is available to be read. Typically, ready times are set on pins, and represent the time at which the pin will have a valid value. Note that a pin may have different ready times depending on the ready times of other pins in the circuit. Specifically, if the ready times of some pins are set to a large value, pins which are driven by those pins will also have large ready times.

An Operation Ready Time is the maximum ready time of the output pins of an operation which drive another part of the mapped circuit.

Negative Infinity is an infinitely large negative number. In computer systems, "infinity" is represented as a very large number. Negative infinity is represented by a very large negative number. In properly functioning programs, no input should create a value of magnitude equal to or greater than the magnitude of the value used for infinity or negative infinity. Infinity and negative infinity are special values; neither of these values is used in computations. In one embodiment, a value used to represent infinity is $2^{32}-1=4294967295$ and the value used to represent negative infinity is $-<2^{-}-1>=-4294967295$.

A Selector is a software representation of a part which has n data inputs, n control lines, and one data output. Each control line corresponds to a data input. The selector sets its data output to be the value of the data input whose control line value is 1. If no control line has a value of 1, or if more than one control line has a value of 1, then the value of the data output is undefined.

An Activation Condition is a software representation of a cell which drives a control line of a selector.

A Multicycle Operation is an operation which requires a time longer than one clock cycle to complete.

A Pipelined Operation also requires more than one clock cycle to complete. A pipelined operation is divided into multiple groups of logic, each of which executes in a single clock cycle. There is a group of registers between each group of logic, so that the results of each group of logic is stored at the end of each clock cycle. Thus, the pipelined operation can evaluate more than one set of inputs simultaneously.

A StartPoint is a circuit element at which timing of the circuit starts. StartPoints include the clock pins on sequential parts, and primary inputs and outputs.

A StopPoint is a circuit element at which tracing of transitive fanin or fanout stops. StopPoints include levels of hierarchy, the Data or "D" pins on sequential parts, and primary inputs and outputs.

A Cluster is a group of operations which will be implemented on the same piece of hardware. For example, an adder and a subtracter may be in the same cluster. Eventually, they might be implemented by an Arithmetic Logic Unit (ALU) which can perFile form both addition and subtraction.

3.0 Overview of Synthesis using Behavioral Compiler

Figure 2:
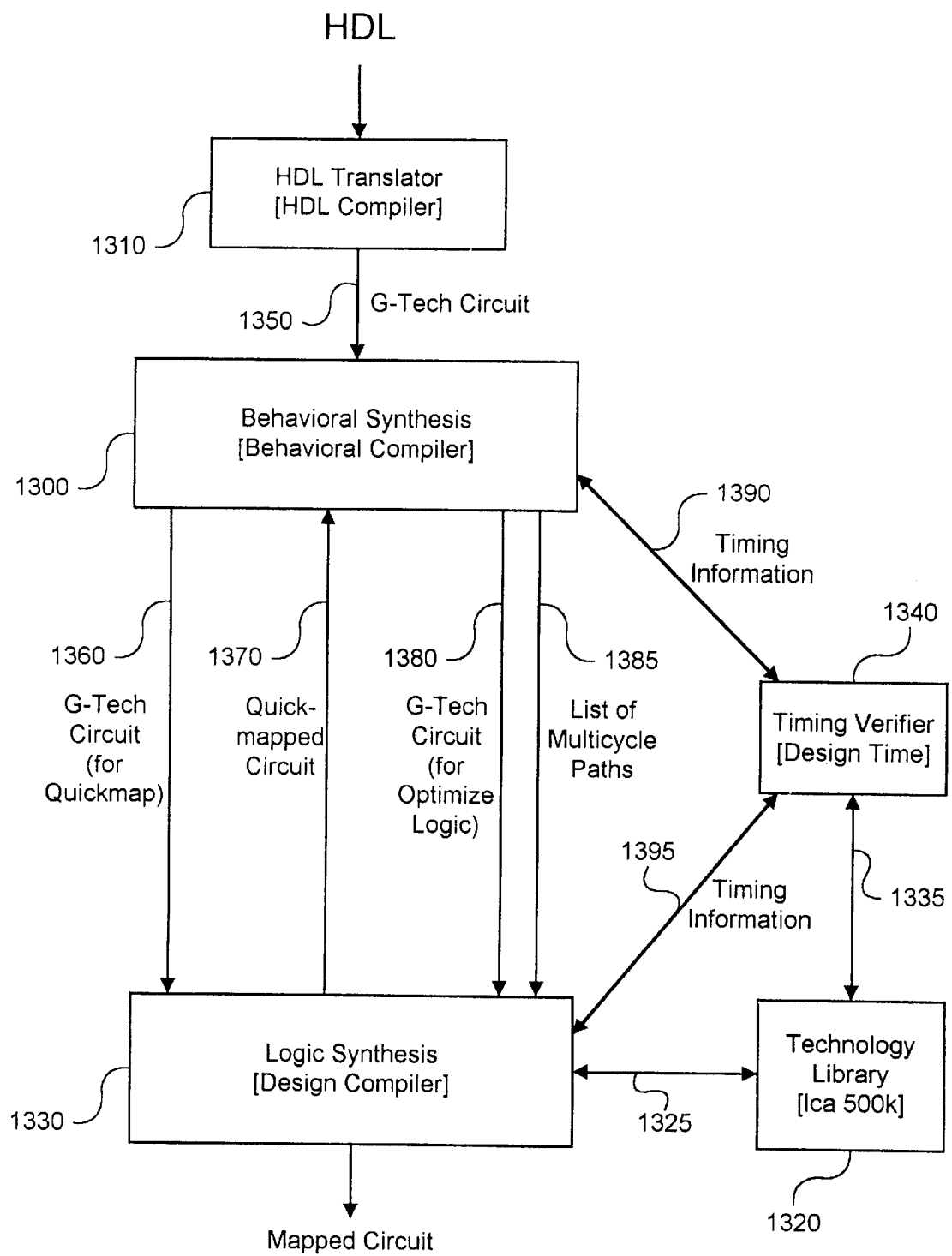
FIG. 2 is a block diagram showing the components of a synthesis system according to the present invention.

FIG. 2 is a block diagram showing the components of a synthesis system according to the present invention. Each of these components is implemented by processor 109 executing instructions stored in memory 104. The components may also use data which is stored in memory 104.

HDL translator 1310 translates HDL source code into generic logic. A conventional HDL translator such as Verilog Compiler version 3.2b from Synopsys, Inc. in Mountain View, Calif. or VHDL Compiler version 3.2b from Synopsys, Inc. in Mountain View, Calif. preferably is used.

The present invention preferably is implemented in behavioral synthesis 1300. One embodiment of behavioral synthesis 1300 is Behavioral Compiler from Synopsys, Inc. in Mountain View, Calif.

Technology library 1320 is used to characterize physical gates which can be built by a semiconductor vendor such as LSI Logic, Inc. in Milpitas, Calif. One embodiment of a technology library is the lca500k gate library, available from LSI Logic, Inc. The technology library contains gates from which a mapped circuit can be built, as well as delay information for the gates and for nets used to connect the gates. Technology library 1320 is implemented as a database stored in memory 104.

Logic synthesis 1330 improves circuits by decreasing the area used to build them, or the delay from inputs to outputs. Logic synthesis 1330 can also map generic logic into a specific technology library 1320. One embodiment of logic synthesis 1330 is Design Compiler version 3.2b from Synopsys, Inc. in Mountain View, Calif.

Timing verifier 1340 estimates delays in a mapped circuit. Estimating the delays in a mapped circuit, or timing the mapped circuit, involves tracing from the inputs of the circuit to the outputs of the circuit and calculating cumulative delays in the circuit. It is possible to set ready times on individual pins in the circuit. The timing verifier 1340 will use such times as the actual ready time for the pins on which they are set. Once the mapped circuit is timed, each pin in the circuit has a ready time which is accessed using the timing verifier. One embodiment of a timing verifier is DesignTime from Synopsys, Inc. in Mountain View, Calif.

Verilog Compiler, Behavioral Compiler, Design Compiler, and DesignTime are all commercially available from Synopsys, Inc. in Mountain View, Calif.

Double-headed arrow 1390 indicates that behavioral synthesis 1300 uses the timing verifier 1340 to estimate delays in accordance with the present invention. Behavioral synthesis 1300 instructs the timing verifier to time a mapped circuit, and the timing verifier 1340 provides behavioral synthesis with delay information regarding the mapped circuit.

Double-headed arrow 1395 indicates that logic synthesis 1330 also uses the timing verifier 1340 to estimate delays.

Arrow 1350 indicates that the HDL translator 1310 creates a GTech circuit from the source HDL.

Arrow 1360, arrow 1370, and arrow 1380 indicate that behavioral synthesis 1300 and logic synthesis 1330 interact by passing software representations of the circuit back and forth. These interactions are shown in more detail in FIG. 3. Arrow 1360 represents behavioral synthesis 1300 passing a GTech circuit to logic synthesis 1330 for Quick Mapping in step 1520 of FIG. 3. Arrow 1370 represents logic synthesis 1330 returning a mapped circuit to behavioral synthesis 1300. Arrow 1380 represents behavioral synthesis passing the final output of behavioral synthesis 1300, which is another GTech circuit, to logic synthesis 1330 for logic optimization in step 160 of FIG. 3.

Arrow 1385 indicates that behavioral synthesis 1300 informs logic synthesis 1330 of a list of multicycle paths. Behavioral synthesis 1300 creates these paths by instantiating multicycle operations in the circuit. Behavioral synthesis must send the list of multicycle paths to logic synthesis 1330 so that logic synthesis 1330 will not try to optimize the multicycle paths into a single cycle. Multicycle path annotation will be discussed further in a later section.

Figure 3:
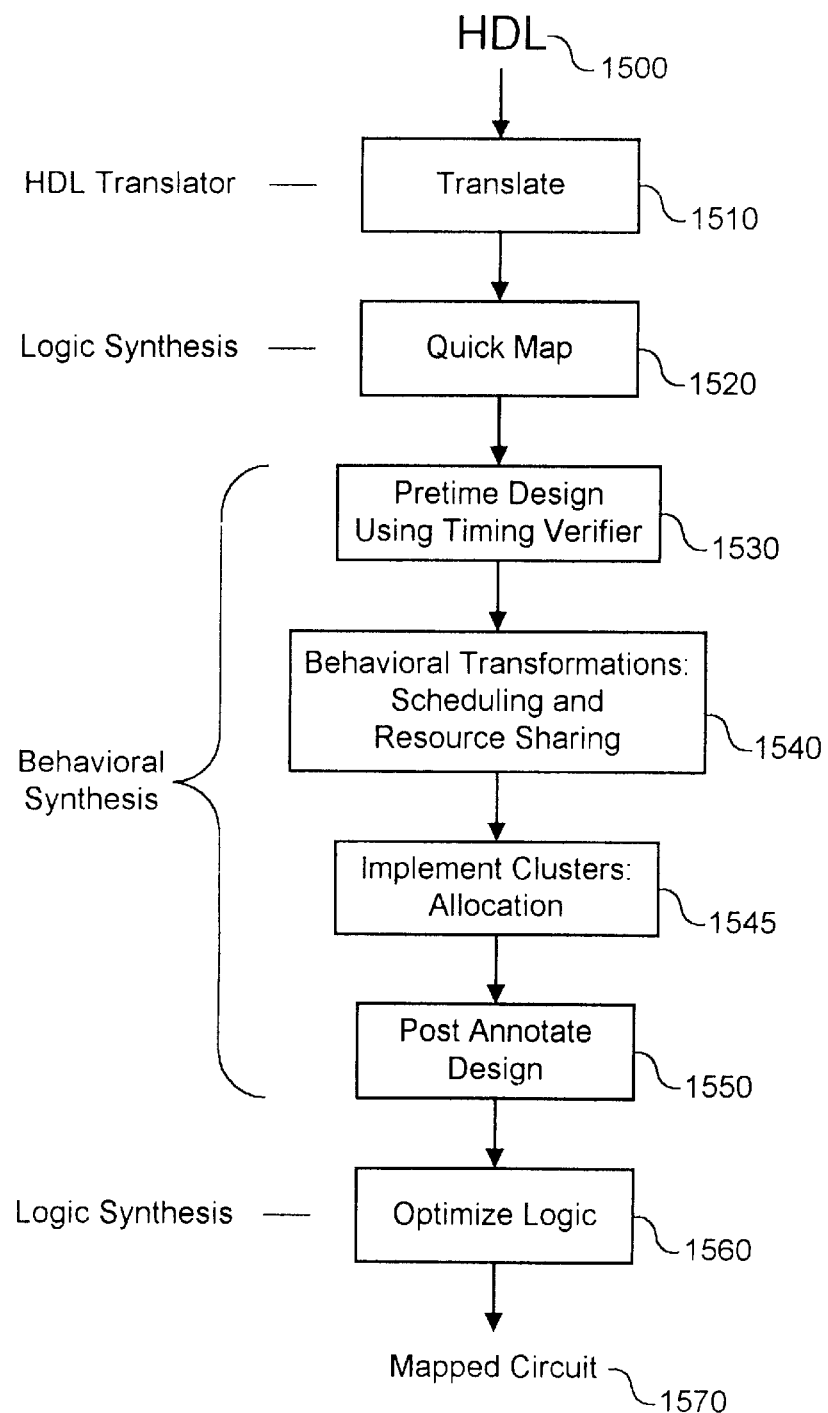
FIG. 3 is a flowchart showing how Behavioral Synthesis fits into the overall synthesis strategy.

FIG. 3 is a flowchart showing how behavioral synthesis fits into the overall synthesis strategy. This flowchart shows how a mapped circuit is created from a source HDL description. The input to synthesis is an HDL description 1500 of a digital circuit. Such a description may be written in VHDL, Verilog, or some other HDL.

The HDL description is translated in step 1510 to generic logic using an HDL translator 1310.

The resulting translated circuit is then Quick Mapped in step 1520. Quick mapping uses logic synthesis 1330 to create a mapped circuit by mapping the GTech circuit to a specific technology such as lca500k. The translated circuit must be mapped so that it can be timed. Quick mapping spends a small amount of time optimizing the digital circuit. The GTech representation of the circuit is retained for later use in step 1540.

The mapped circuit is then pretimed in step 1530 and the results are stored. Pretiming may be performed using a conventional timing verifier 1340 such as DesignTime available from Synopsys, Inc. of Mountain View, Calif. A method for pretiming mapped circuits using a conventional timing verifier will be described in a later section.

In step 1540, behavioral transformations are applied to the original GTech circuit using the information which was calculated using the mapped representation of the circuit. The behavioral transformations are performed by behavioral synthesis 1300 using the timing information created in step 1530.

Step 1545 implements any clusters which were created by the behavioral transformations of step 1540. Behavioral synthesis 1300 instantiates specific hardware modules to implement the operations of any clusters created by behavioral synthesis.

In step 1550, the circuit is post annotated with additional information. Post annotated information is used when the logic is optimized in step 1560. An example of information which may be post annotated is multicycle path constraints. Methods for post annotating multicycle path constraints will be described in a later section. In an alternate embodiment, it is possible to post annotate the design in step 1550 before the clusters are implemented in step 1545. Methods for post annotating the design before and after the clusters are implemented will be described in a later section.

In step 1560, the resulting logic is optimized using conventional logic synthesis 1330. The output of logic optimization is a mapped circuit description which can be sent to a silicon vendor for fabrication. For example, a description of the mapped circuit can be output using LSI Netlist format and sent to LSI Logic in Milpitas, Calif. for fabrication.

Note that step 1530 and step 1550 of FIG. 3 link behavioral synthesis 1300 to the timing verifier 1340 and logic synthesis 1330. To achieve high-quality implementation results, behavioral synthesis 1300 must obtain proper timing and area information from the timing verifier 1340 and logic synthesis 1330. During scheduling, behavioral synthesis 1300 uses technology-specific timing and area information for high-level components, such as adders, multipliers, and memories. Behavioral synthesis 1300 also requires tight links to logic synthesis 1330 to set appropriate logic-level constraints in step 1550. These requirements can be met only when behavioral synthesis 1300 and logic synthesis 1330 are tightly integrated into the same development system. Another requirement is that a technology-specific library 1320 must be available to behavioral synthesis 1300 for high quality of results.

Subsequent sections describe how behavioral synthesis 1300 obtains technology specific timing information from the timing verifier 1340, and provides constraints to logic synthesis 1330.

4.0 Example Circuit

Figure 6:
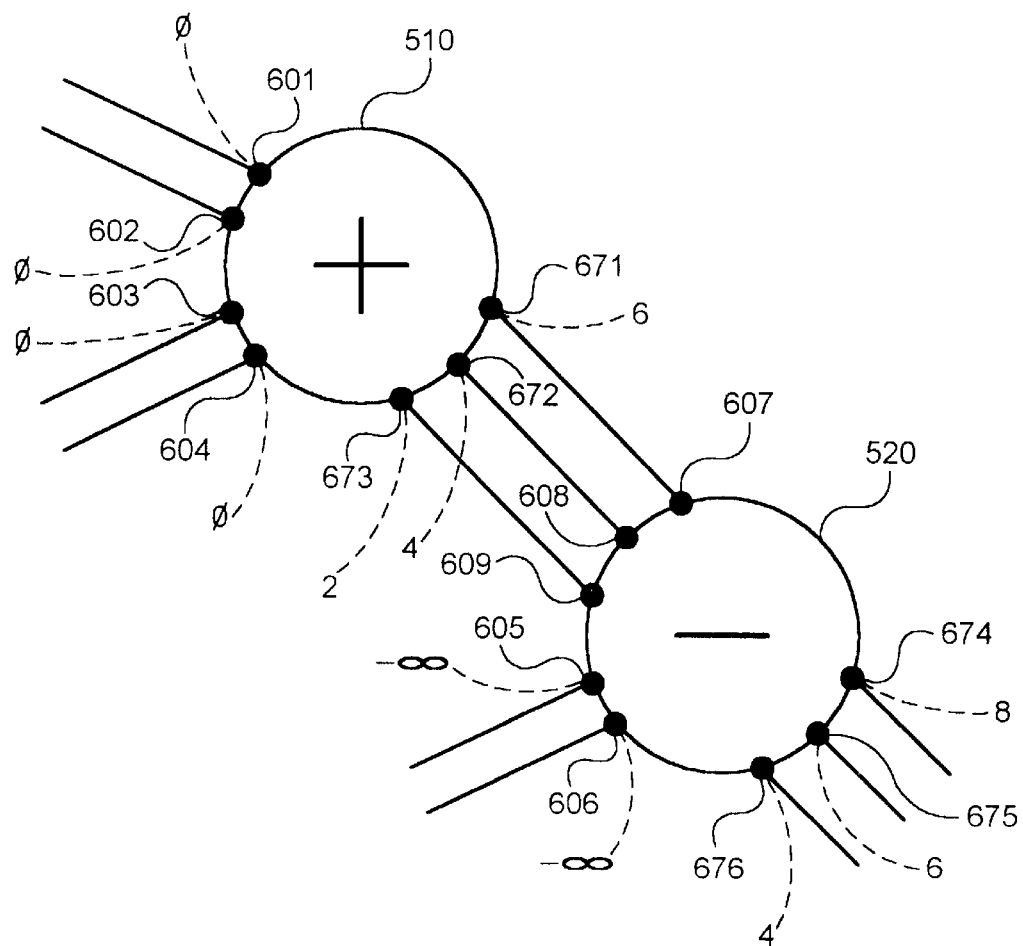
FIG. 6 shows a representation of a bit level view of a portion of the circuit stored in memory of FIG. 5.

FIG. 4 shows a Verilog HDL source code fragment. Such HDL source code is the input to the synthesis process shown in FIG. 3. FIG. 5 shows a graphical representation of the mapped circuit stored in memory which is created from the Verilog source shown in FIG. 4. Such a mapped circuit is the output of step 1520 of FIG. 3. FIG. 6 shows a bit level view of a portion of the circuit from FIG. 5. Each circuit element of FIG. 5 includes bit level information such as that shown in FIG. 6. An adder 510, an adder 530, a subtracter 520, and a comparator 540 are operations in the circuit. A selector 550 uses an activation condition 560 and an activation condition 570 to determine which value to drive onto a net 599.

Activation condition 560 selects the output of subtracter 520 and adder 510. It contains a list of pointers to subtracter 520 and adder 510 as indicated by the dashed lines between them. Activation condition 570 selects the output of adder 530. It contains a pointer to adder 530 as indicated by the dashed lined between them. These activations are said to be associated with the operations whose results they select. Note that both activation condition 560 and activation condition 570 are driven by comparator 540.

Port A 515, port B 525, port C 535, port X 545, and port Y 555 are the inputs to the circuit. These inputs and the circuit output, port R 565, are the stop points in this circuit.

5.0 Pretiming the Design

FIG. 7, FIG. 9, FIG. 10, FIG. 12, and FIG. 13 show how timing information is precalculated in step 1530 of FIG. 3. The precalculated timing information is used by the behavioral synthesis transformations of step 1540 of FIG. 3. This timing information is specific to the circuit being synthesized, and is more accurate than timing information available through conventional methods such as unit delays or operation libraries. Furthermore, part of the timing information includes the effects of chaining operations in the specific circuit. Such chaining information is not available using conventional techniques.

It will be understood by person of ordinary skill in the art that the steps of FIG. 3, FIG. 7, FIG. 9, FIG. 10, FIG. 12, FIG. 13, FIG. 16, and FIG. 18 are embodied as processor 109 of FIG. 1 executing instructions stored in memory 104.

Each method is described in general terms, and then a specific example is presented.

5.1 Creating Chaining Tables

5.1.1 Method

Figure 7:
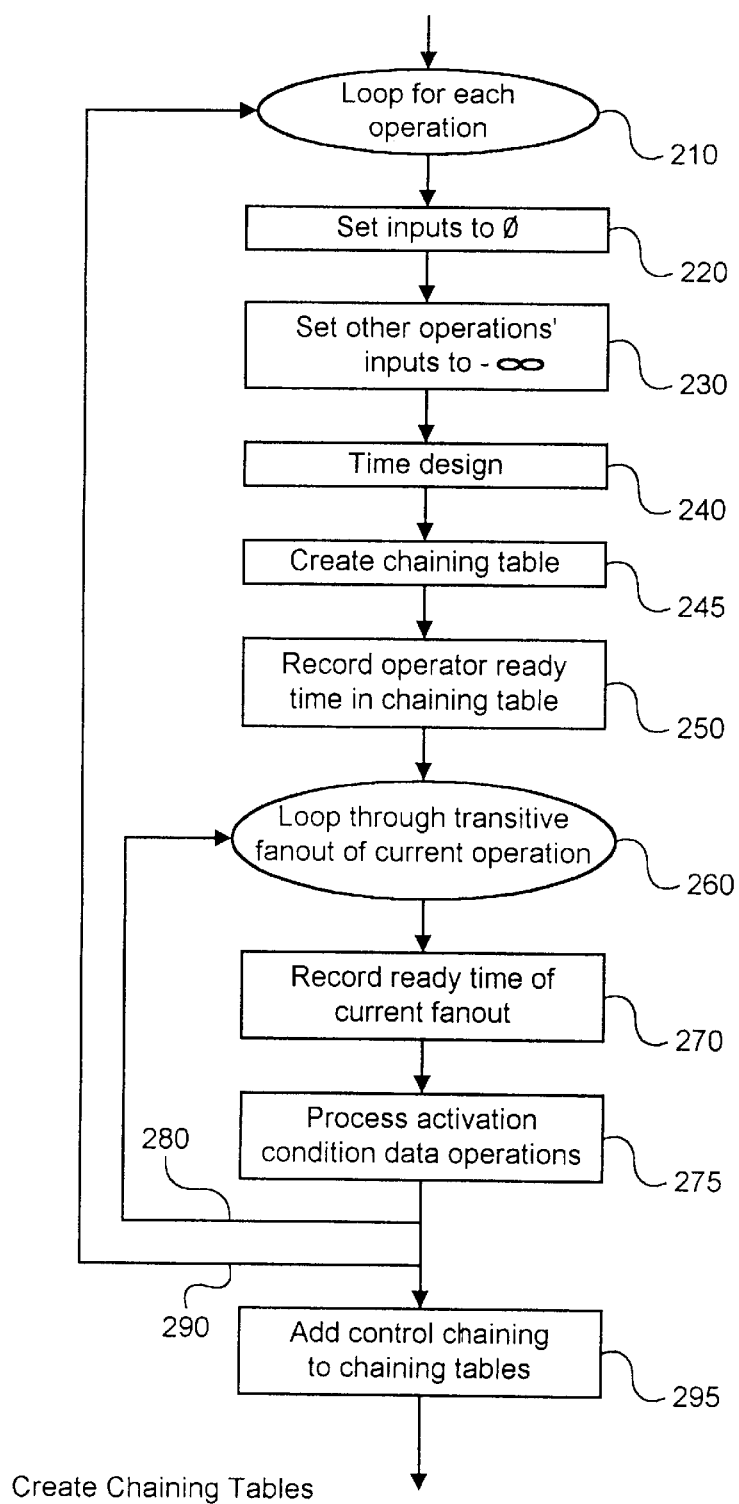
FIG. 7 is a flowchart showing steps for precalculating ready times in a mapped circuit.

FIG. 7 shows a method for precalculating operation ready times in a design. The input to the process is a mapped circuit. The output of the process is a set of chaining tables, one chaining table for each operation in the circuit. In one embodiment, chaining tables are stored as sets of tuples. Each tuple contains an operation and an operation ready time for that operation. In another embodiment, chaining tables are stored as hash tables. The keys to the hash table are operations or activation conditions and the data is a number which represents the operation ready time of that operation. In one embodiment, the chaining tables for each operation are stored with that operation. Each operation contains pointers to each of the members of its chaining table.

In FIG. 7, loop 210 loops over each operation in the mapped circuit. In each iteration of the loop, the operation being processed is called the current operation.

In step 220, the ready time of each input of the current operation is set to 0. Setting the ready time for inputs of pipelined operations is a special case. The ready time of the registers which drive the last stage of the pipelined operation must be set to the appropriate value. All methods in this document which set the ready time of pipelined operations set the ready time of the registers which drive the last stage of the pipelined operation.

In step 230, the ready time of the startpoints in the mapped circuit is set to negative infinity.

In step 240, the mapped circuit is timed using a conventional timing verifier such as DesignTime by Synopsys, Inc. of Mountain View, Calif.

In step 245, a chaining table is created for the current operation. An empty set is created and added to the operation.

Step 250 records the operation ready time of the current operation in the chaining table of the current operation by adding a tuple including the current operation, and the operation ready time of the current operation.

Loop 260 loops through all the operations and activation conditions in the transitive fanout of the current operation. In each iteration of the loop, the operation or activation condition being processed is called the current fanout.

Step 270 records the operation ready time of the current fanout in the chaining table of the current operation. The key is the current fanout, and the data is the operation ready time of the current fanout.

Figure 9:
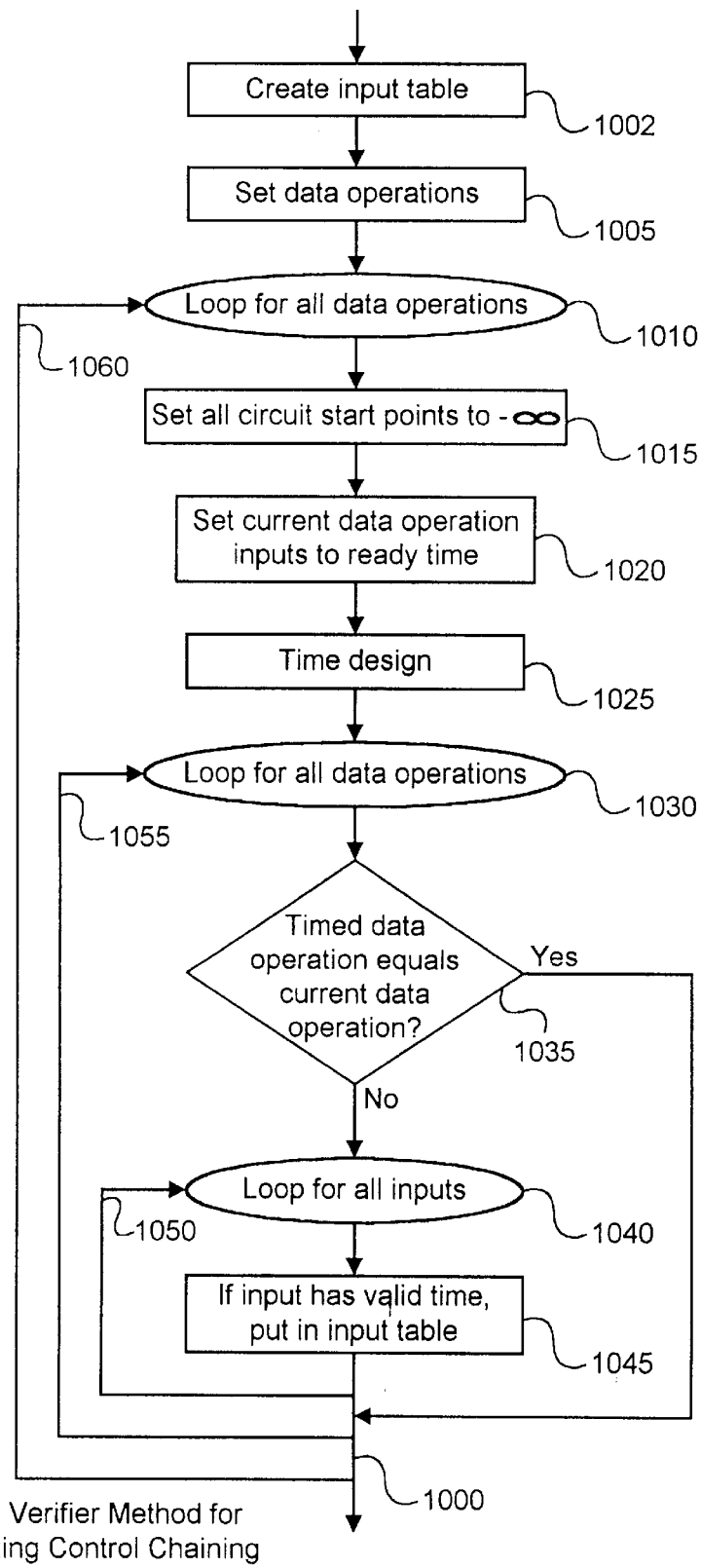
FIG. 9 is a flowchart showing steps for precalculating control chaining times in a mapped circuit.
Figure 12:
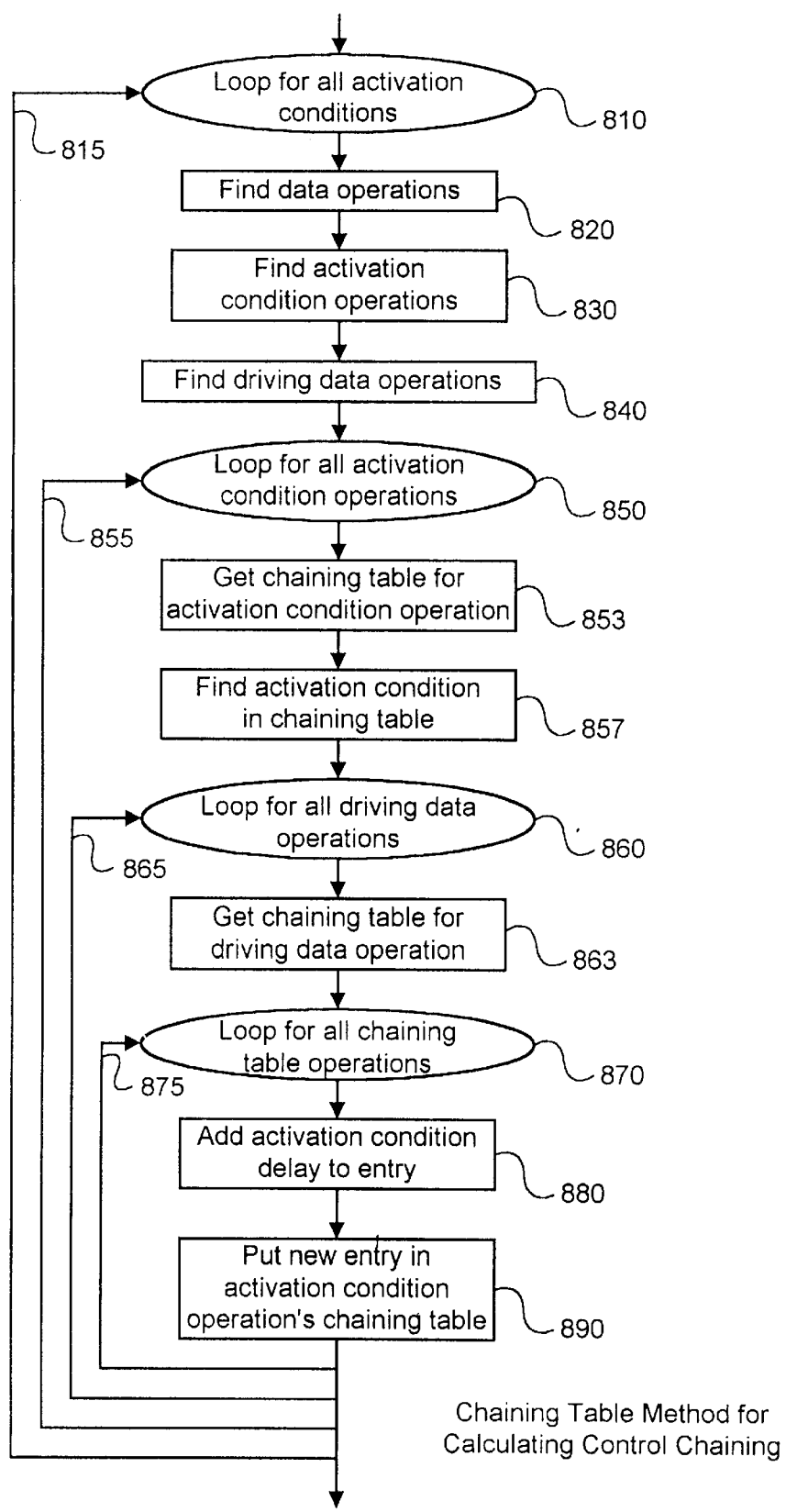
FIG. 12 is a flowchart showing alternate steps for precalculating control chaining times in a mapped circuit.
Figure 13:
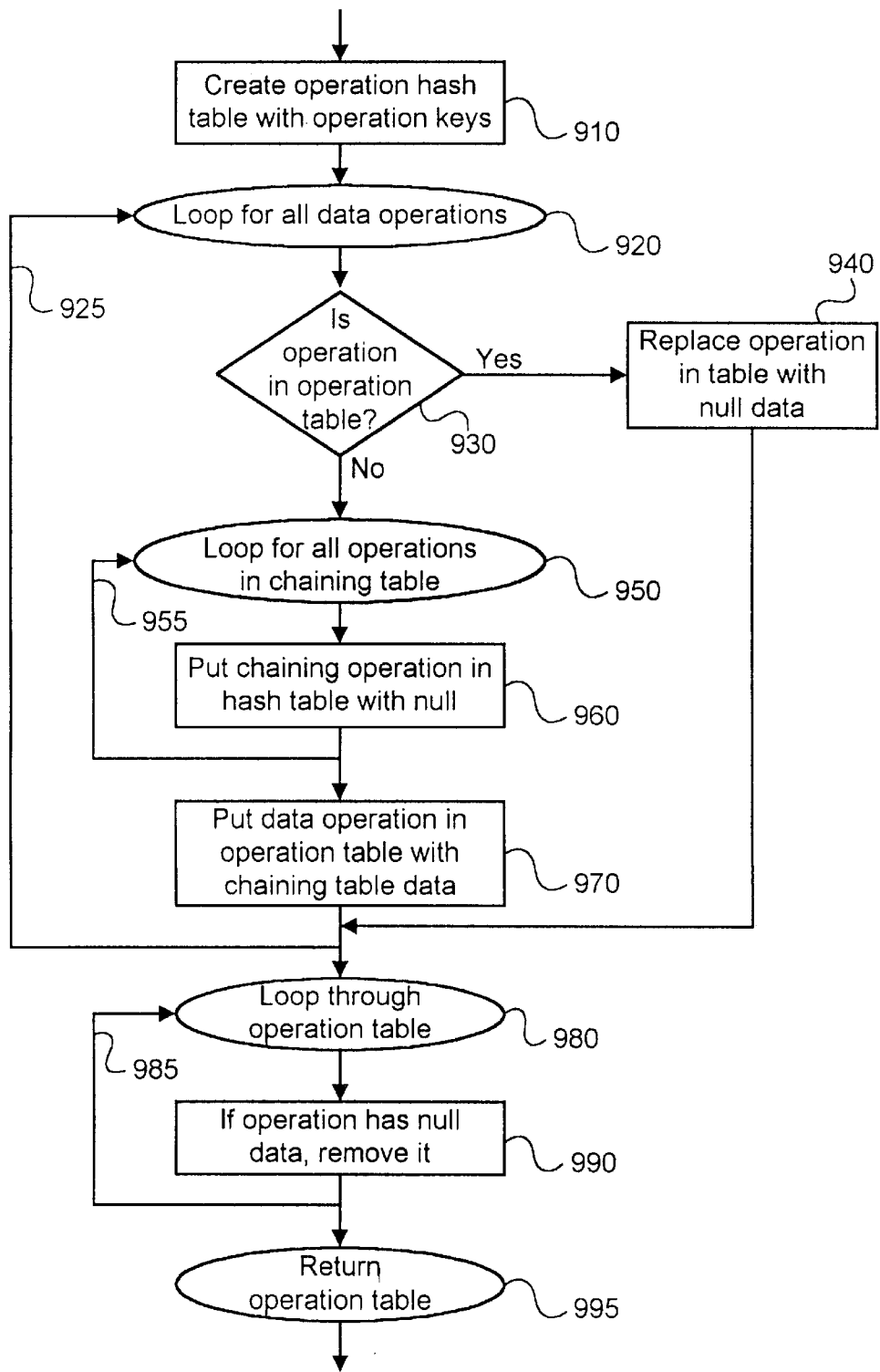
FIG. 13 is a flowchart showing steps for determining which data operations drive a set of operations in a circuit.

If the current fanout is an activation condition, Step 275 processes the data operations which are associated with this activation condition. This step is used to calculate operation ready times for control chaining. A method for this is shown in FIG. 9. If the alternate embodiment shown in FIG. 12 and FIG. 13 is used, this step is not performed. Instead, the method of FIG. 12 and FIG. 13 is performed in step 295, after the chaining tables have been created without control chaining information.

Arrow 280 shows that the loop 260 repeats through the transitive fanout of the current operation.

Arrow 290 shows that the loop 210 repeats for each operation in the mapped circuit.

Step 295 adds control chaining to the chaining tables using the method shown in FIG. 12 and FIG. 13. This step is only used if step 275 is not used.

At the end of this process, the operation ready time of each operation and its fanouts has been recorded in chaining tables associated with each operation.

5.1.2 Example

Figure 8:
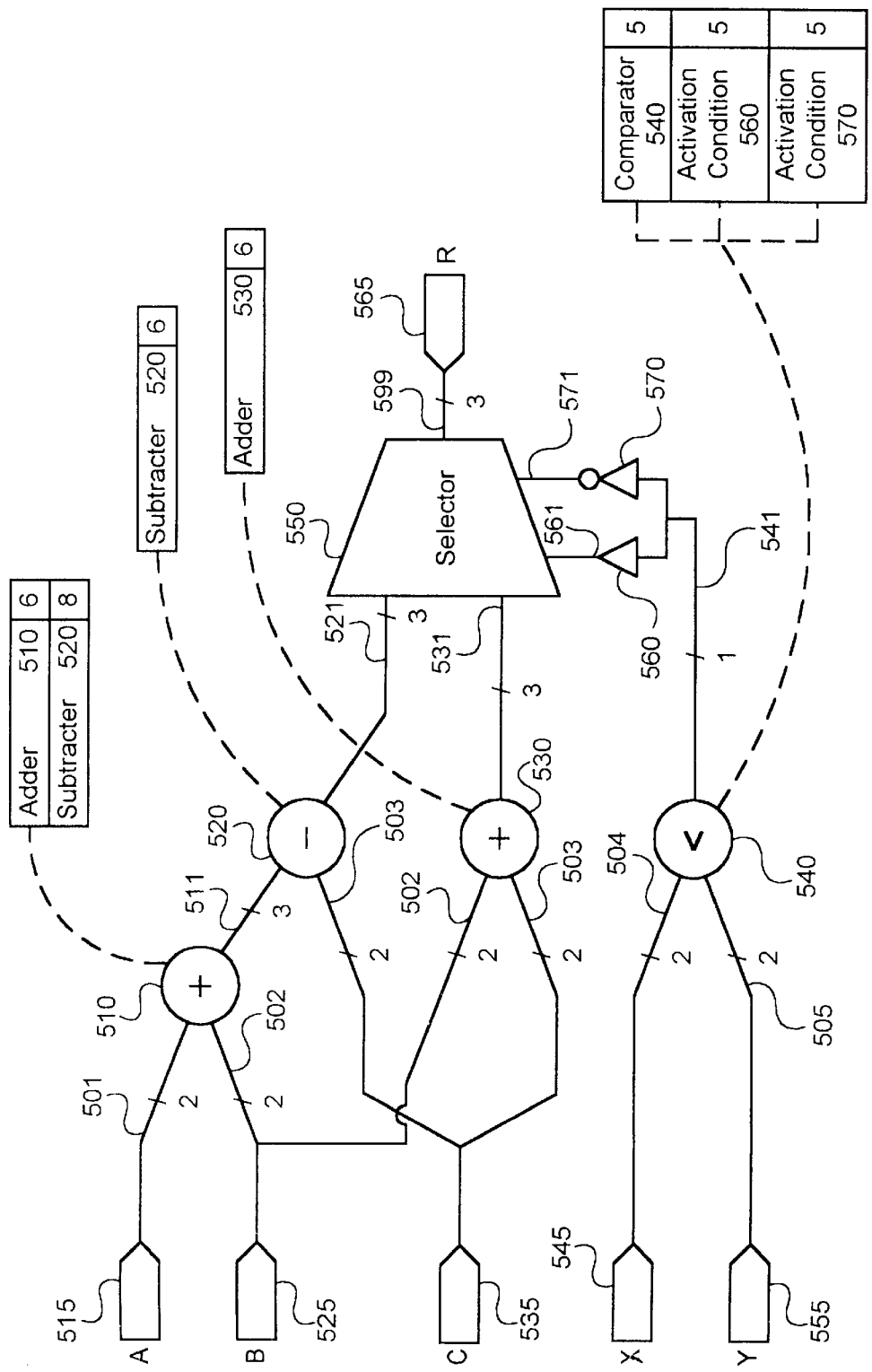
FIG. 8 shows the circuit representation of FIG. 5 with chaining tables.

This example uses the Verilog HDL source code fragment shown in FIG. 4 and the circuit shown in FIG. 5 and FIG. 6 to perform the method for precalculating timing shown in FIG. 7. FIG. 8 shows the mapped circuit with the chaining tables produced by this method annotated on each operation.

Loop 210 of FIG. 7 loops over each operation in the circuit shown in FIG. 5. These operations are adder 510, adder 530, subtracter 520, and comparator 540. Adder 510 is considered first; the current operation is set to adder 510.

In step 220, the ready time for each of the input pins for adder 510 is set to 0. Pin 601, Pin 602, Pin 603 and Pin 604 all have their ready times set to 0.

In step 230, the ready times of all of the startpoints in the circuit are set to negative infinity. The ready times of port 515, port 525, port 535, port 545, and port 555 are set to negative infinity.

Next, the circuit is timed in step 240 using a conventional timing verifier. After the circuit is timed, each pin in the circuit has a ready time which can be obtained from the timing verifier.

An empty chaining table is created for adder 510 in step 245.

The operation ready time of the current operation, adder 510 is added to the chaining table in step 250. As shown in FIG. 6, the ready time of pin 671 is 6, the ready time of pin 672 is 4, and the ready time of pin 673 is 2, so the operation ready time of adder 510 is 6. Each of the pins' ready times is available from the timing verifier. The chaining table now contains the following information: ((adder 510, 6)). The outside set of parentheses delimits the contents of the chaining table. The inner tuple, (adder 510, 6) is an operation, timing value pair in the chaining table.

Next, loop 260 loops through the transitive fanout of the adder 510. Adder 510 drives subtracter 520; there is no other transitive fanout.

The operation ready time of the current fanout, subtracter 520 is added to the chaining table in step 270. In this example, the ready time of pin 674 is 8, the ready time of pin 675 is 6, and the ready time of pin 676 is 4, so the operation ready time of subtracter 520 is 8. Note that the operation ready time of subtracter 520 is the cumulative time of adder 510 and subtracter 520, including the effects of chaining the two operations. The chaining table now contains the following information: ((adder 510, 6), (subtracter 520, 8)). The current fanout, subtracter 520, is not an activation condition, so step 275 does nothing.

Since there are no other operations in the transitive fanout of adder 510, loop 260 terminates.

The process then continues in a similar fashion for each of the operations in the circuit. This example does not include step 295. It will be described in connection with FIG. 12 and FIG. 13. At the end of the process, the following chaining tables are associated with each of the operations in the design:

adder 510: ((adder 510, 6), (subtracter 520, 8))
subtracter 520: ((subtracter 520, 6))
adder 530: ((adder 530, 6))
comparator 540: ((comparator 540, 5), (activation condition 560, 5), (activation condition 570, 5))

FIG. 8 shows the circuit of FIG. 5 with the preceding chaining tables annotated onto the operations. Use of chaining tables is discussed in a later section.

5.2 Adding Control Chaining to Chaining Tables

This section describes two embodiments for precalculating control chaining operation ready times. Control chaining occurs when the control signals for a selector are generated in the same cycle as the data signals which they select. Thus, precalculating control chaining operation ready times involves adding the operations from the datapath into the chaining tables of operations which drive a control signal. This allows the behavioral synthesis transformations to determine if it is possible to chain operations which drive a control signal and operations which create the data selected by that control signal into the same cycle.

The first embodiment times the circuit using the timing verifier O(n) times, where n is the number of operations which can be control chained. This can be slow. The second embodiment is more complex, but does not require using the timing verifier at all. Each embodiment may be appropriate, depending on how a person skilled in the art wishes to handle run time versus computer code complexity.

5.2.1 Timing Verifier Method

The following paragraphs describe an embodiment of the invention in which the timing verifier is used to determine which of the operation inputs in the control chain are not driven by any operation in the control chain. This is necessary so that the ready times of the operations in the control chain are set correctly. The following section describes the method.

5.2.1.1 Method

Figure 10:
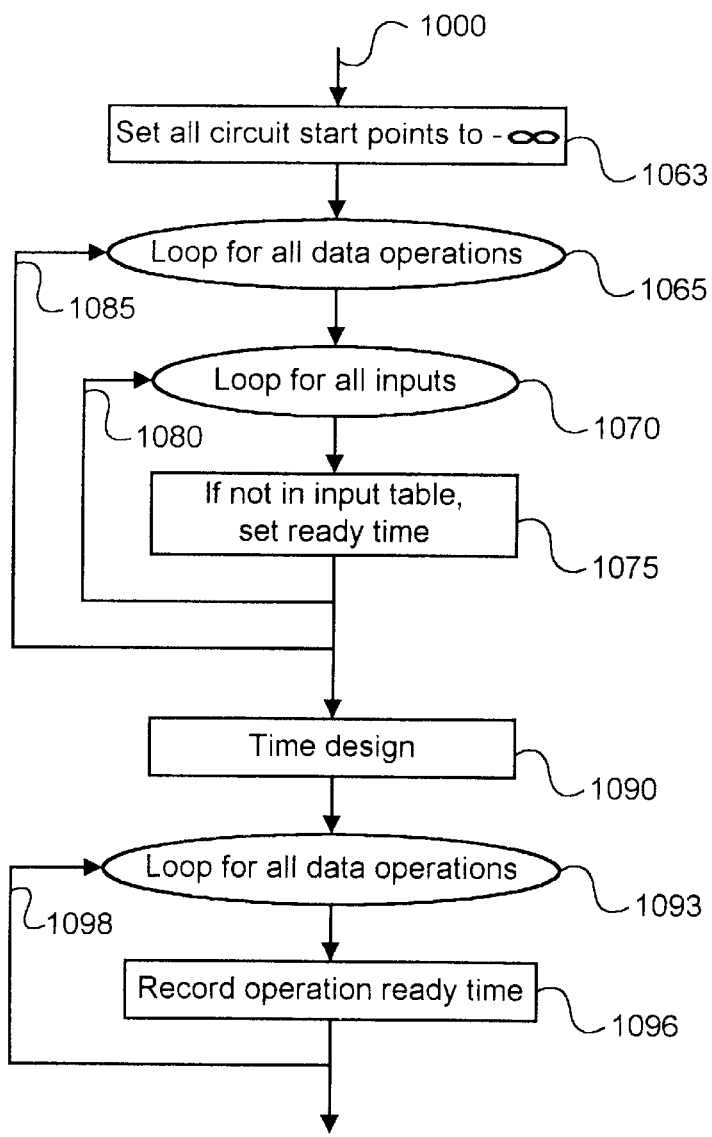
FIG. 10 is a flowchart showing additional steps for precalculating control chaining times in a mapped circuit.

FIG. 9 and FIG. 10 are flowcharts showing steps for precalculating control chaining times using a conventional timing verifier. These figures implement step 275 of FIG. 7.

The input to the process is the current fanout from step 270 of FIG. 7, which is an activation condition, an operation ready time for the current fanout, and the chaining table for the current operation (see FIG. 8). The current fanout will be called the current activation condition in this discussion.

Step 1002 creates an input table. The input table is a hash table which has operation keys, and Null data. A hash table data structure is used to implement a set whose members can be accessed in constant time.

Step 1005 determines which operations are activated by the current activation condition. In one embodiment, a linked list of pointers to each operation is stored with the activation condition. These operations are called the data operations.

Loop 1010 loops over each data operation found in step 1005. In each iteration of the loop, the data operation being processed is known as the current data operation.

Step 1015 sets the inputs of all of the operations in the circuit to negative infinity.

Step 1020 sets the inputs of the current data operation to the operation ready time of the current activation condition.

In step 1025, the mapped circuit is timed using a conventional timing verifier such as DesignTime by Synopsys, Inc. of Mountain View, Calif.

Loop 1030 is a nested loop which loops over each data operation. In each iteration of the loop, the data operation being processed is known as the timed data operation.

Step 1035 checks to see if the timed data operation is equal to the current data operation. If it is, this iteration of the loop is skipped and the process continues with the next iteration of Loop 1030.

If the timed data operation is not equal to the current data operation, Loop 1045 loops over each input to the timed data operation. In each iteration of the loop, the input being processed is known as the current input.

If the current input has a valid ready time, the current input is added to the input table.

Arrow 1050 shows that the loop 1040 repeats for all of the inputs of the timed data operation.

Arrow 1055 shows that the loop 1030 repeats for all of the data operations.

Arrow 1060 shows that loop 1010 repeats for all of the data operations.

Loop 1065 loops over each data operation. In each iteration of the loop, the data operation being processed is known as the current data operation.

Loop 1070 loops over each input to the current data operation. In each iteration of the loop, the input being processed is known as the current input.

If the current input is not in the input table, step 1075 sets the ready time of the current input to be the operation ready time of the current activation condition.

Arrow 1080 shows that the loop 1070 repeats for all of the inputs of the timed data operation.

Arrow 1085 shows that the loop 1065 repeats for all of the data operations.

In step 1090, the mapped circuit is timed using a conventional timing verifier such as DesignTime by Synopsys, Inc. of Mountain View, Calif.

Loop 1093 loops over each data operation. In each iteration of the loop, the data operation being processed is known as the current data operation.

Step 1096 records the operation ready time of the current fanout in the chaining table which was passed as an input to the process. The key is the current fanout, and the data is the operation ready time of the current fanout.

Arrow 1098 shows that the loop 1093 repeats for all of the data operations.

5.2.1.2 Example

Figure 11:
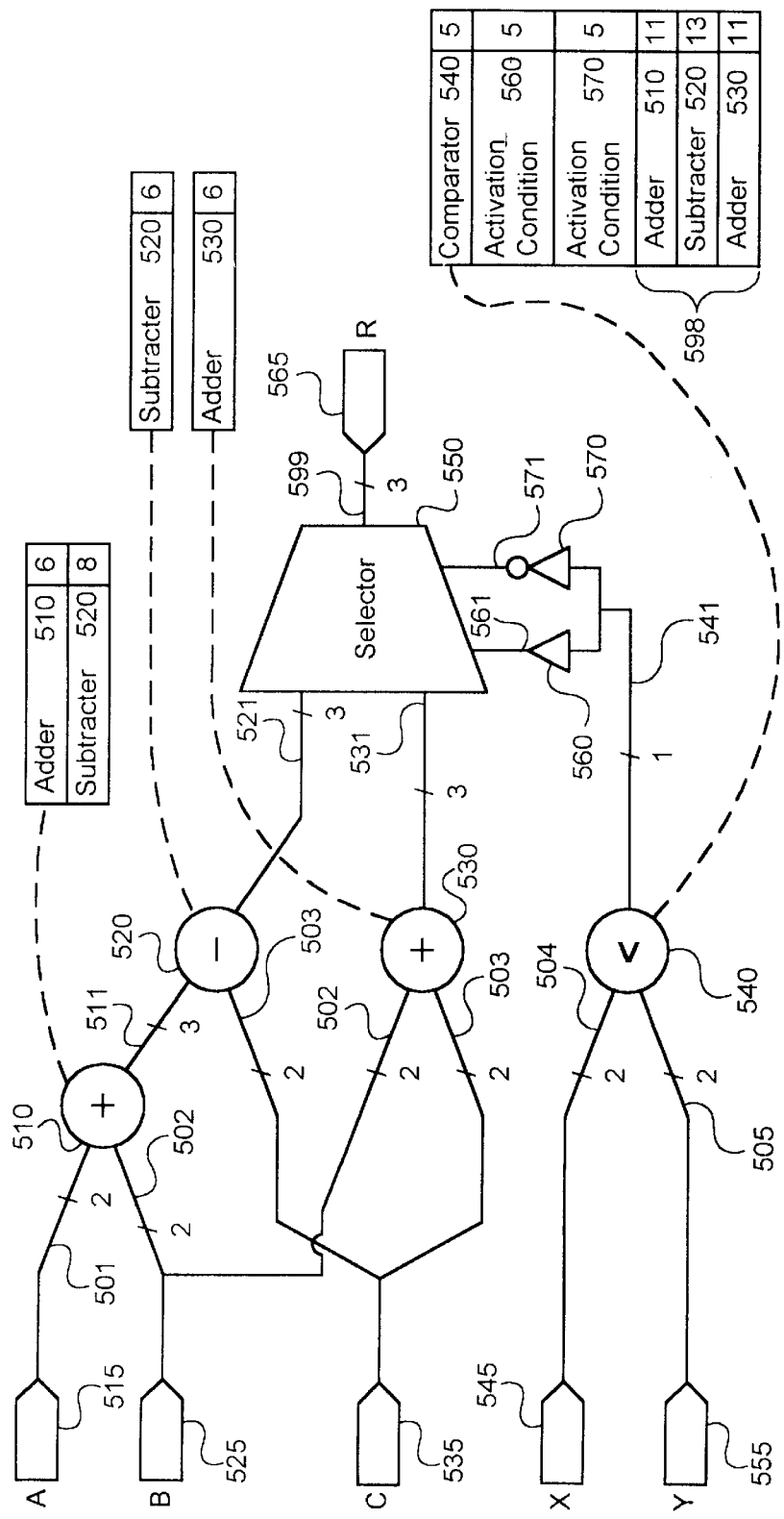
FIG. 11 shows the circuit representation of FIG. 5 with chaining tables including control chaining information.

This example uses the source fragment shown in FIG. 4 and the circuit shown in FIG. 5 and FIG. 6 to perform the timing verifier method for precalculating control chaining shown in FIG. 9 and FIG. 10. This example performs the method once, as invoked from step 275 of FIG. 7. Note that since step 275 is within loop 260, it will be performed once for each iteration of the loop 260. The output of the process, after activation condition 560 and activation condition 570 have both been processed in step 275 during successive iterations of loop 260 of FIG. 7 is shown in FIG. 11.

The input to the process is the activation condition 560, ready time 5 (which is the ready time of activation condition 560), and the chaining table for comparator 540 at the time that activation condition 560 is being processed, ((comparator 540, 5), (activation condition 560, 5)).

In step 1002, an empty hash table is created for the input table.

Step 1005 gets that data operations for activation condition 560 by collecting them from a linked list of pointers. The data operations for activation condition 560 are adder 510 and subtracter 520.

In the first iteration of loop 1010, adder 510 is processed. All operation inputs in the circuit are set to have ready time of negative infinity in step 1015. In step 1020 the inputs to adder 510 are set to the ready time of 5. The design is timed using a conventional timing verifier in step 1025.

The data operations are now processed in inner loop 1030. In the first iteration of loop 1030, step 1035 determines that the timed data operation is adder 510, which is the current operation, so this iteration of the loop is complete.

In the next iteration, subtracter 520 is processed. Loop 1040 loops over all of the inputs to subtracter 520. In each iteration of loop 1040, step 1045 processes the current input's ready time. If an input has a ready time which is not negative infinity, this input is added to the input table. In this case, input 607, input 608, and input 609 of subtracter 520 have valid ready times, which input 605 and input 606 do not. At the end of loop 1040, the input table contains the following entries: (input 607, input 608, input 609).

The process now returns to loop 1010 to process subtracter 520. The ready time of its inputs is set to 5. The ready time of the inputs to other operations in the design are set to negative infinity, and the design is timed. Inner loop 1030 processes adder 510 and finds that all of inputs have ready time negative infinity, and skips subtracter 520 since it is the current operation. This completes the execution of loop 1010.

Next, loop 1065 loops over the data operations, adder 510 and subtracter 520 again. First the inputs of adder 510 are processed in loop 1070. Step 1075 sets the ready time for each input which is not in the input table. Since none of the inputs of adder 510 are in the input table, each of input 601, input 602, input 603 and input 604 is set to have ready time of 5. For subtracter 520, input 605 and input 606 are set to have ready time of 5, but input 607, input 608, and input 609 are in the input table so their ready times are not set.

The design is timed in step 1090. Once again, the data operations adder 510 and subtracter 520 are processed in loop 1093. In the first iteration of loop 1093, the operation ready time of adder 510, 11, is recorded in the chaining table of comparator 540 in step 1096. In the next iteration, the operation ready time of subtracter 520, 13, is recorded in the chaining table of comparator 540 in step 1096. At the end of the process, the chaining table for comparator 540 contains the following information( (comparator 540, 5), (activation condition 560, 5), (adder 510, 11), (subtracter 520, 13)).

Note that on the next iteration of loop 260 of FIG. 7, activation condition 570 will be processed. Both activation condition 570, and its data operation, adder 530, will be added to the chaining table for comparator 540. The chaining tables of all the operations, including control chaining information 598, are shown in FIG. 11.

5.2.2 Chaining Table Method

The following paragraphs describe an embodiment of the invention in which the chaining tables from FIG. 8 are used to determine which of the operation inputs in the control chain are not driven by any operation in the control chain. This method implements step 295 of FIG. 8. The following section describes the method.

5.2.2.1 Method for Adding Control Chain Timing using Chaining Tables

FIG. 12 shows steps of another embodiment for calculating the timing for possible control chaining of operations. The input to the process is a quick mapped circuit which has timing precalculated using the method shown in FIG. 7.

Loop 810 loops over each activation condition in the mapped circuit. In each iteration of the loop, the activation condition being processed is known as the current activation condition.

Step 820 determines which operations are activated by the current activation condition. In one embodiment, a linked list of pointers to each operation is stored with the activation condition. These operations are called the data operations.

Step 830 finds all of the operations which drive the activation condition. These operations are identified by tracing the transitive fanin of the activation condition. These operations are called the activation condition operations.

Step 840 finds which of the data operations are not driven by any of the other data operations. These data operations are called the driving data operations. A method for determining which data operations are driving data operations is shown in FIG. 13.

Loop 850 loops over each activation condition operation. In each iteration of the loop, the activation condition operation being processed is known as the current activation condition operation.

Step 853 finds the chaining table for the current activation condition operation. In one embodiment, the chaining tables for all of the operations in the circuit are stored with the operation. Thus, step 853 collects all of the members of chaining table from the current activation condition operation.

Step 857 retrieves the ready time for the current activation condition from the chaining table of the current activation condition operation. In one embodiment, step 857 searches the members of the chaining table until the current activation condition is found. The operation ready time is stored in the tuple containing the current activation condition.

Loop 860 loops over each driving data operation. In each iteration of the loop, the driving data operation being processed is known as the current driving data operation.

Step 863 finds the chaining table for the current driving data operation.

Loop 870 loops over each chaining table entry. In each iteration of the loop, the chaining table entry being processed is known as the current chaining table entry.

In step 880, the operation ready time of the current activation condition is added to the operation ready time in the current chaining table entry. The operation ready time of the current activation condition is obtained from the chaining table of the current activation condition operation.

In step 890, a new entry is created in the chaining table of the current activation condition operation. This entry has the operation of the current chaining table entry, and the operation ready time which was calculated in step 880. If there is already an entry in the chaining table of the current activation condition operation for the operation of the current chaining table entry, then this entry is reused. The operation ready time of this entry is set to be the maximum of the operation ready time which is already present, and the operation ready time which was calculated in step 880.

Arrow 875 shows that loop 870 repeats for each entry in the chaining table.

Arrow 865 shows that loop 860 repeats for each driving data operation.

Arrow 855 shows that loop 850 repeats for each activation condition operation.

Arrow 815 shows that loop 810 repeats for each activation condition in the circuit.

At the end of this process, each of the activation condition operations has new entries in its chaining table which indicate the possible delay of chaining the data operations with the activation condition operation.

The following example shows how entries are added to the chaining table for comparator 540 of FIG. 5.

5.2.2.2 Method for Finding the Driving Data Operations

FIG. 13 shows how the driving data operations are found in step 840 of FIG. 12. The driving operations of a set are those operations which are not driven by any other operation in the set. The input to the process is a quick mapped circuit which has timing precalculated using the method shown in FIG. 7, and a list of operations. The output of the process is a hash table whose keys are the driving operations of the input set, and whose data is the chaining table for the operations.

Step 910 creates the operation table. This is a hash table whose keys are operations, and whose data is chaining tables, or Null.

Loop 920 loops over each data operation in the input set. In each iteration of the loop, the data operation being processed is known as the current operation.

Step 930 checks to see if the current operation is in the operation table.

If the current operation is in the operation table, step 940 replaces the data for the current operation in the operation table with Null.

If the current operation is not in the operation table, Loop 950 loops over each chained operation in the chaining table for the current operation. In each iteration of the loop, the chained operation being processed is known as the current chained operation.

Step 960 puts the current chained operation into the operation table with Null data. If the current chained operation was already in the hash table, its former data value is overwritten with Null.

Arrow 955 shows that loop 950 repeats for each chained operation.

Loop 980 loops over each operation in the operation table. In each iteration of the loop, the operation being processed is known as the current operation. If the current operation has Null data, it is removed from the operation table in step 990.

Arrow 985 shows that loop 980 repeats for each operation in the operation table.

The operation table is returned from the process in step 995.

5.2.2.3 Example

This example uses the Verilog HDL source fragment shown in FIG. 4 and the circuit shown in FIG. 5 and FIG. 6 to perform the method for precalculating control chaining shown in FIG. 12 and FIG. 13.

The circuit already has chaining table information calculated as described above. FIG. 8 shows the circuit of FIG. 5 with chaining tables. For convenience, the chaining tables are repeated here:

adder 510: ((adder 510, 6), (subtracter 520, 8))
   subtracter 520: ((subtracter 520, 6))
   adder 530: ((adder 530, 6))
   comparator 540: ((comparator 540, 5), (activation condition 560, 5), (activation condition 570, 5))

Loop 810 FIG. 12 of loops over each activation condition in the circuit. These are activation condition 560 and activation condition 570. Activation condition 560 is considered first; the current activation condition is set to activation condition 560.

In step 820, the data operations associated with activation condition 560 are found. Activation condition 560 contains a list of pointers to adder 510 and subtracter 520.

The activation condition operations are found in step 830 by tracing the transitive fanin from activation condition 560 to any stop points. In the circuit of FIG. 5, the stop points for the transitive fanin of activation condition 560 are port X 545 and port Y 555. The activation condition operation is comparator 540.

Now the driving data operations of the set (adder 510, subtracter 520) are found in step 840 using the method shown in FIG. 13. First, an operation hash table is created in step 910 of FIG. 13.

Next, loop 920 loops through each of the data operations, adder 510 and subtracter 520. The first operation is adder 510. Step 930 determines that it is not yet in the operation table, so loop 950 loops through adder 510's chaining table which is ((adder 510, 6), (subtracter 520, 8)). Adder 510 is added to the operation table with Null data in step 960. In the next iteration of loop 950, subtracter 520 is added to the operation table with Null data in step 960. Loop 950 then terminates because all of the operations in the chaining table have been processed. The operation table now contains the following values: ((adder 510, Null), (subtracter 520, Null)).

In step 970, adder 510 is added to the operation table with a pointer to its chaining table ((adder 510, 6), (subtracter 520, 8)) as data. Note that the previous tuple for adder 510, (adder 510, Null), is overwritten. The operation table now contains the following values: ((adder 510, ((adder 510, 6), (subtracter 520, 8))), (subtracter 520, Null)). Note that the adder 510's chaining table rather than a pointer to the chaining table is shown for the sake of clarity of this example.

Loop 920 now processes subtracter 520. Step 940 determines that subtracter 520 is already in the operation table, and this iteration of loop 920 terminates.

Next, loop 980 loops through the operation table. If an operation has Null data, it is removed from the operation table in step 990. Loop 980 leaves adder 510 in the operation table because it includes its chaining table, but removes subtracter 520.

The operation table is returned to the main process shown in FIG. 12. The operations in the operation table are the driving data operations.

Loop 850 now loops through all of the activation condition operations, in this case comparator 540. The chaining table for comparator 540, which is ((comparator 540, 5), (activation condition 560, 5), (activation condition 570, 5)) is retrieved from comparator 540 in step 853. The operation ready time for the current activation condition, activation condition 560, is retrieved from this chaining table in step 857. The operation ready time is 5.

Loop 860 now loops through all of the driving data operations in the operation table returned from the process shown in FIG. 13.

Adder 510 is the only driving data operation in this case. Its chaining table is obtained in step 863 from the data of the operation table. The chaining table entries for adder 510 include: ((adder 510, 6), (subtracter 520, 8)). Loop 870 loops through each of these entries. First adder 510 is processed. Step 880 adds the operation ready time of activation condition 560, 5, to the operation ready time for adder 510, 6: 6+5=11. In step 890, a new chaining table entry, (adder 510, 11), is created and added to the chaining table of comparator 540.

In the next iteration of loop 870, subtracter 520 is processed. Step 880 adds the operation ready time of activation condition 560, 5, to the operation ready time for subtracter 520, 8: 8+5=13. Step 890 creates a new chaining table entry, (subtracter 520, 13), and adds it to the chaining table of comparator 540. The chaining table for comparator 540 now includes information for adder 510 and subtracter 520 since they are associated with activation condition 560: ((comparator 540, 5), (activation condition 560, 5), (activation condition 570, 5), (adder 510, 11), (subtracter 520, 13)).

The process is now complete for activation condition 560. The process repeats in a similar fashion for activation condition 570. At the end of the process, the chaining table for comparator 540 includes chaining information for the data operations associated with both activation condition 560 and activation condition 570 as shown in FIG. 11.

5.3 Using Chaining Tables

As shown in FIG. 11, the chaining tables in the previous examples have the following information when they are complete:

adder 510: ((adder 510, 6), (subtracter 520, 8))
   subtracter 520: ((subtracter 520, 6))
   adder 530: ((adder 530, 6))
   comparator 540: ((comparator 540, 5), (activation condition 560, 5), (activation condition 570, 5), (adder 510, 11), (subtracter 520, 13), (adder 530, 11))

It will be readily apparent to those skilled in the art that various schedulers may be used with the chaining tables generated in the previous examples. The following example uses a simple greedy As Soon As Possible (ASAP) scheduler. The present invention is not intended to be limited to a greedy ASAP scheduler but may be used with many different schedulers. A greedy ASAP scheduler attempts to schedule operations in the earliest possible control step, while meeting the constraints.

Figure 14:
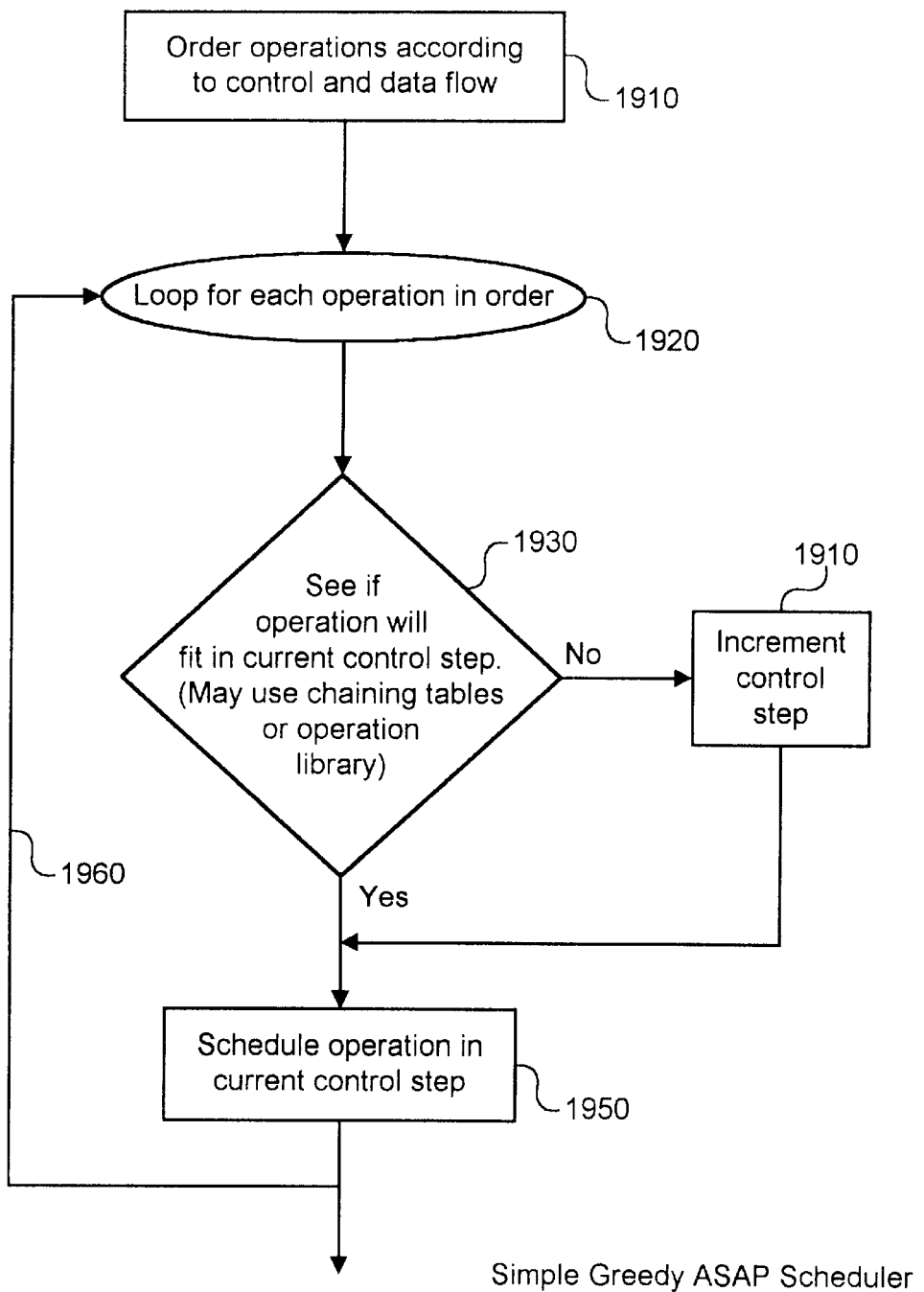
FIG. 14 is a flowchart showing steps for a simple greedy ASAP scheduler.

FIG. 14 is a flowchart showing steps for a simple greedy ASAP scheduler. The steps of this flowchart are intended purely as an example of a scheduler. More sophisticated scheduling methods are described in *High-Level Synthesis* (subtitled *Introduction to Chip and System Design*) by Daniel Gajski, Nikil Dutt, Allen C-H Wu, and Steve Y-L Lin, Kluwer Academic Publishers, 1992, which is hereby incorporated by reference and will subsequently be referred to as *High-Level Synthesis* by Gajski et al. Chapter 7 of this book specifically focuses on scheduling. This sample scheduler is only used to demonstrate how chaining tables are used. It does not handle all cases correctly. This method will be used to schedule the circuit of FIG. 11 with a clock period of 10.

Step 1910 orders all of the operations in the circuit according to the control and data flow. Ordering operations according to control and data flow is discussed in *High-Level Synthesis* by Gajski et al. In this example, the operations are ordered (comparator 540, adder 530, adder 510, subtracter 520). Note that this ordering does account for the fact that adder 510 and subtracter 520 may execute in parallel with adder 530 because adder 510 and subtracter 520 are on a disjoint conditional branch from adder 530. However, this full ordering will suffice for this example.

The basic procedure for the simple greedy ASAP scheduler is as follows. Loop 1920 loops over each operation in order. Step 1930 checks to see if the operation will fit into the current control step. Note that step 1930 must account for any operation chaining or control chaining which occurs if operations are chained into a single control step. If the current operation fits into the current control step, step 1950 schedules that operation into the current control step. If not, step 1940 increments the control step and the operation is scheduled into the next control step.

The simple greedy ASAP scheduler can use chaining tables to ascertain if operations fit into control steps. For example, using the chaining tables as shown above and in FIG. 11, loop 1920 first schedules comparator 540. As there are no other operations in control step 0, step 1930 checks the chaining table for comparator 540 and sees that it can be scheduled into control step 0 by step 1950. Adder 530 is then considered. Since comparator 540 is already in this step and its output controls the use of the other operations, its chaining table is used. The chaining table for comparator 540 indicates that adder 530 will have a chained delay of 11. Thus, the control step is incremented to 1 in step 1940 and adder 530 is scheduled into control step 1 in step 1950. Likewise, adder 510 is scheduled into control step 1. Next, subtracter 520 is considered. Since subtracter 520 is driven by adder 510, adder 510's chaining table must be used to see if subtracter 520 will also fit into this control step. The chaining table for adder 510 indicates that the chained delay for adder 510 and subtracter 520 will be 8, so subtracter 520 is also scheduled into control step 1. FIG. 15 (*a*) shows the circuit of FIG. 11 scheduled into 2 control steps.

Note that scheduling can make better decisions using chaining tables than using operation libraries. For example, consider an operation library which only contains delay information for each operation as follows:

adder 510: 6
subtracter 520: 6
adder 530: 6
comparator 540: 5

Consider again the method of FIG. 14. In this example, the operation library as shown above is used to schedule the circuit of FIG. 5. Chained delays are calculated by summing the operation delays from the operation library. Step 1910 orders the operations as before: (comparator 540, adder 530, adder 510, subtracter 520).

Using the operation library as shown above, loop 1920 first schedules comparator 540 into control step 0. Adder 530 is then considered. The chained delay for comparator 540 and adder 530 is 11: 5+6=11. Thus, the control step is incremented to 1 in step 1940 and adder 530 is scheduled into control step 1. Likewise, adder 510 is scheduled into control step 1. Next, subtracter 520 is considered. Since subtracter 520 is driven by adder 510 the chained delay must be used to see if subtracter 520 will fit into this control step. However, the chained delay is 6+6=12, so the control step is incremented and subtracter 520 is scheduled into control step 2. FIG. 15 (*b*) shows the circuit of FIG. 11 scheduled into 3 control steps, as required when using operation libraries.

In another example, consider the case when the clock period is 14. Using the chaining table of comparator 540, the scheduler determines that it is possible to chain comparator 540, adder 510, and subtracter 520, as well as adder 530 into the same cycle. However, when operation libraries are used, the scheduler determines that comparator 540 can be control chained with adder 510, but subtracter 520 will not fit into the same cycle because the cumulative delay for these operations is 5+6+6=17. Thus, the circuit will require 2 control steps instead of only 1 to schedule.

6.0 Post Annotating the Design

Post annotating constraints in step 1550 of FIG. 3 allows behavioral synthesis 1300 to constrain logic synthesis 1330 on operations that were introduced by behavioral synthesis in step 1540. Logic synthesis 1330 is used to optimize logic in step 1560 of FIG. 3.

6.1 Multicycle Constraints

One type of constraint which is post annotated is multicycle constraints. Annotating a multicycle constraint involves informing logic synthesis that certain paths in the circuit will require more than one cycle of delay. Logic synthesis adds this constraint to its internal representation of the path. The human designer must annotate multicycle paths manually for manually specified register transfer level designs. Behavioral synthesis uses the same functionality for annotating multicycle paths in logic synthesis as the human designer. No changes are made to logic synthesis and a conventional logic synthesis process may be used. When behavioral synthesis builds an operation which requires multiple cycles to execute, behavioral synthesis informs logic synthesis that each of the paths through this operation requires multiple cycles by sending logic synthesis a list of multicycle paths. This ensures that logic synthesis does not attempt to optimize these paths into a single cycle.

The following sections describe two methods for annotating multicycle constraints. The method shown in FIG. 16 shows how multicycle constraints are annotated onto paths in the circuit after the clusters in the circuit have been implemented. The method shown in FIG. 18 shows how multicycle constraints are annotated onto paths in the circuit before the clusters are implemented.

6.1.1 Method

FIG. 16 shows how multicycle constraints are post annotated in step 1550 of FIG. 3. It shows a method for post annotating multicycle paths in a mapped circuit. The input to the process is a register transfer level circuit. In one embodiment, multicycle path constraints must be annotated from the clock pin of a register to the Q pin of a register. FIG. 16 shows how to find a path endpoint driven by a multicyle operation. In other embodiments, multicycle path constraints may be annotated in other ways.

Step 400 creates an input table and an output table. The input and output tables are hash tables which have pins as keys and Null data. The hash tables store each value exactly once, so the same value can be added multiple times without introducing duplicates. This is a usual method of creating a set with unique members.

Loop 420 loops over each multicycle operation in the circuit. In each iteration of the loop, the data operation being processed is known as the current operation.

Step 421 clears the input and output tables of any values.

Loop 428 loops over each input pin of the current operation. In each iteration of the loop, the input being processed is known as the current input.

Step 430 traces each branch of the transitive fanin of the current input until a Q pin of a register is encountered.

Step 435 adds the clock pin of each of the registers found to the input table.

Arrow 440 shows that loop 428 repeats for each input pin of the current operation.

Loop 445 loops over each output pin of the current operation. In each iteration of the loop, the input being processed is known as the current output.

Step 450 traces each branch of the transitive fanout of the current output until a D pin of a register is encountered.

Step 455 adds each D pin to the output table.

Arrow 460 shows that loop 428 repeats for each output pin of the current operation.

Loop 470 loops over each clock pin in the input table. In each iteration of the loop, the clock pin being processed is known as the current clock.

Loop 475 loops over each D pin in the output table. In each iteration of the loop, the D pin being processed is known as the current D.

Step 480 annotates the clock to D path. In one embodiment, a command set_multicycle_path -from [clock pin] -to [D pin] is used to notify the timing verifier that this is a multicycle path.

Arrow 485 shows that loop 475 repeats for each clock pin in the input table.

Arrow 490 shows that loop 470 repeats for each D pin in the output table.

Arrow 465 shows that loop 420 repeats for each operation of the current cluster.

The output of the process is an RTL circuit where multicycle paths are annotated as such.

6.1.2 Example

FIG. 17 shows a representation of a portion of a circuit in memory after its clusters have been implemented. Multiplier 1440 is a multicycle operation. Selector 1410 chooses whether the output of register 1110 or register 1130 drives input pin 1443. Input pin 1444 is driven by register 1120. The control lines of selector 1410 are driven by activation condition 1415 and activation condition 1425, which are driven by register 1420 and register 1430, respectively. Output pin 1446 and output pin 1447 of multiplier 1440 drive register 1180 and register 1190. This section describes how the method of FIG. 16 is applied to this subcircuit.

First, step 400 of FIG. 16 creates an input table and an output table.

Loop 420 loops over each multicycle operation in the circuit, in this case multiplier 1440. Loop 428 then loops over each input to multiplier 1440, including input 1443 and input 1444.

Step 430 traces each branch of the transitive fanin of input 1443 until a Q pin is encountered on each branch. First step 430 traces the fanin of input 1443 to selector 1410. The inputs of selector 1410 are traced back to Q pin 1113, Q pin 1133, Q pin 1423, and Q pin 1433. Step 435 then adds the clock pin of each of the registers whose Q pins were found to the input table. This includes clock pin 1111, clock pin 1131, clock pin 1421, and clock pin 1431.

In the next iteration of loop 425, input 1444 is processed. Step 430 traces the transitive fanin of input 1443 and finds Q pin 1123 of register 1120. Clock pin 1121 of register 1120 is added to the input table in step 435.

At this point, the input table has been built and contains the following clock pins:

(clock pin 1111, clock pin 1121, clock pin 1131, clock pin 1421, clock pin 1431).

Loop 445 loops over each output from multiplier 1440, including output 1446 and output 1447. Step 450 traces the transitive fanout of output 1446 to D pin 1182 which is added to the output table in step 455. In the next iteration of the loop, step 450 traces the transitive fanout of output 1447 to D pin 1192 which is also added to the output table in step 455.

At this point, the output table has been built and contains the following D pins:

(D pin 1182, D pin 1192).

The process now uses the input and output tables to determine all of the paths through the multicycle operation. Loop 470 loops over each clock pin in the input table. Inner loop 475 loops over each D pin in the output table. Each clock pin to D pin path is annotated in step 480 by issuing the following series of commands to logic synthesis. These commands inform logic synthesis of the list of multicycle paths which must be annotated.

set_multicycle_path -from clock pin 1111 -to D pin 1182
set_multicycle_path -from clock pin 1121 -to D pin 1182
set_multicycle_path -from clock pin 1131 -to D pin 1182
set_multicycle_path -from clock pin 1421 -to D pin 1182
set_multicycle_path -from clock pin 1431 -to D pin 1182
set_multicycle_path -from clock pin 1111 -to D pin 1192
set_multicycle_path -from clock pin 1121 -to D pin 1192
set_multicycle_path -from clock pin 1131 -to D pin 1192
set_multicycle_path -from clock pin 1421 -to D pin 1192
set_multicycle_path -from clock pin 1431 -to D pin 1192

These commands annotate all of the multicycle paths in the circuit. The annotated circuit is then passed to logic synthesis so that the logic can be optimized in step 160 of FIG. 3.

6.1.3 Alternate Method

FIG. 18 is a flowchart showing an alternate method for post annotating multicycle constraints in step 1550 of FIG. 3. The input to the process is a register transfer level circuit. In one embodiment, multicycle path constraints must be annotated from the clock pin of a register to the D pin of a register. FIG. 16 shows how to find a path endpoint driven by a multicyle operation. In other embodiments, multicycle path constraints may be annotated in other ways.

The method of FIG. 18 is used before the circuit has been fully constructed. This method implements step 1550 of FIG. 3 when step 1550 is performed before step 1545. This method is used after Behavioral Compiler has decided which operations will be shared, but before the GTech circuit has been modified so that the shared operations are actually implemented with the same piece of hardware. At this point, there exist clusters in the design which group operations which will be shared. The operations of the cluster will eventually be implemented on the same piece of hardware, but currently are implemented using multiple pieces of hardware. In addition, there exist activation conditions which will drive the control lines of selectors which have not yet been built. These activation conditions are associated with operations in the clusters. The new selectors will control the inputs and outputs of the shared operations.

Step 1200 creates an input table and an output table. The input and output tables are hash tables which have pins as keys and Null data.

Loop 1205 loops through all the clusters in the circuit. In each iteration of the loop, the cluster being processed is called the current cluster.

Step 1210 clears the input and output tables of any values.

Loop 1220 loops over each operation in the current cluster. In each iteration of the loop, the data operation being processed is known as the current operation.

Step 1222 checks to see if there are any activation conditions which are associated with the current operation. In one embodiment, if the operation has an activation condition associated with it, the operation contains a pointer to that activation condition.

If there is an activation condition associated with the current operation, step 1224 traces the transitive fanin of the activation condition to clock pins for each of branch of the transitive fanin. Each clock pin is added to the input table in step 1226.

Loop 1228 loops over each input to the timed data operation. In each iteration of the loop, the input being processed is known as the current input.

Step 1230 traces each branch of the transitive fanin of the current input until a Q pin of a register is encountered.

Step 1235 adds the clock pin of each register whose Q pin was found in step 1230 to the input table.

Arrow 1240 shows that loop 1228 repeats for each input pin of the current operation.

Loop 1245 loops over each output to the timed data operation. In each iteration of the loop, the input being processed is known as the current output.

Step 1250 traces each branch of the transitive fanout of the current output until a D pin of a register is encountered.

Step 1255 adds each D pin to the output table.

Arrow 1260 shows that loop 1245 repeats for each output pin of the current operation.

Arrow 1265 shows that loop 1220 repeats for each operation of the current cluster.

Loop 1270 loops over each clock pin in the input table. In each iteration of the loop, the clock pin being processed is known as the current clock.

Loop 1275 loops over each D pin in the output table. In each iteration of the loop, the D pin being processed is known as the current D.

Step 1280 annotates the clock to D path. In one embodiment, a command set_multicycle_path -from [clock pin] -to [D pin] is used to notify the timing verifier that this is a multicycle path.

Arrow 1285 shows that loop 1275 repeats for each clock pin in the input table.

Arrow 1290 shows that loop 1270 repeats for each D pin in the output table.

Arrow 1295 shows that loop 1205 repeats for each cluster of the circuit.

The output of the process is an RTL circuit where multicycle paths are annotated as such.

6.1.4 Example of Alternate Method

FIG. 19 shows the portion of a the circuit of FIG. 17 before its clusters are implemented. Cluster 1135 groups multiplier 1140 and multiplier 1150. As in FIG. 17, register 1110, register 1120, and register 1130 drive the inputs to the multipliers. In this circuit, activation condition 1415 and activation condition 1425 do not yet drive a selector. However, these activation conditions do contain pointers to the multipliers they are associated with, as indicated by the dashed lines between the activation conditions and the multipliers. As in FIG. 17, register 1420 drives activation condition 1415, and register 1430 drives activation condition 1425. Because there are still two multipliers, register 1180 and register 1190 are driven by selector 1160 and selector 1170 which select between the outputs of the multipliers.

This section describes how the alternate method of FIG. 18 is applied to this subcircuit.

First, step 1200 creates an input table and an output table.

Loop 1205 loops through all the clusters in the circuit. In this example, cluster 1135 is the only cluster.

Step 1210 clears the input and output tables of any values.

Loop 1220 loops over each operation in the current cluster; multiplier 1140 and multiplier 1150.

In the first iteration of loop 1220, step 1222 checks to see if there are any activation conditions which are associated with multiplier 1140. Multiplier 1140 contains a pointer to activation condition 1415. Step 1224 traces the transitive fanin of activation condition 1415 to Q pin 1423 of register 1420. Clock pin 1421 of register 1420 is added to the input table in step 1226.

Loop 1228 loops over each input to multiplier 1140, including input 1141 and input 1142. Step 1230 traces each branch of the transitive fanin of input 1141 to Q pin 1113 of register 1110. Clock pin 1111 of register 1110 is added to the input table in step 1235. In the next iteration of loop 1225, step 1230 traces the transitive fanin of input 1142 to Q pin 1123; clock pin 1121 is added to the input table in step 1235.

Loop 1245 loops over each output to multiplier 1140, including output 1148 and output 1149. Step 1250 traces each branch of the transitive fanout of input 1148 to D pin 1182 which is added to the output table in step 1255. In the next iteration of loop 1245, step 1250 traces the transitive fanin of output 1149 to D pin 1192 which is added to the output table in step 1255.

At this point, the input and output tables contain the following pins:

Input table: (clock pin 1111, clock pin 1121, clock pin 1421)

Output table: (D pin 1182, D pin 1192)

Multiplier 1150 is processed in the next iteration of loop 1220 using the same steps as for multiplier 1140. Note however that the transitive fanin of multiplier 1150 shares many of the same Q pins as the transitive fanin of multiplier 1140. For example, the transitive fanin of input 1151 includes Q pin 1123 of register 1120 which has clock pin 1121. As described above, clock pin 1121 is already present in the input table. However, since the input table is a hash table, clock pin 1121 can be added to the input table multiple times but only one unique entry will remain.

Once multiplier 1150 is processed, the input and output tables contain the following pins:

Input table: (clock pin 1111, clock pin 1121, clock pin 1131, clock pin 1421, clock pin 1431).

Output table: (D pin 1182, D pin 1192)

The process now uses the input and output tables to determine all of the paths through the multicycle operation. Loop 1270 loops over each clock pin in the input table. Inner loop 1275 loops over each D pin in the output table. Each clock pin to D pin path is annotated in step 1280 by issuing the following series of commands to logic synthesis. These commands inform logic synthesis of the list of multicycle paths which must be annotated.

set_multicycle_path -from clock pin 1111 -to D pin 1182
    set_multicycle_path -from clock pin 1121 -to D pin 1182
    set_multicycle_path -from clock pin 1131 -to D pin 1182
    set_multicycle_path -from clock pin 1421 -to D pin 1182
    set_multicycle_path -from clock pin 1431 -to D pin 1182
    set_multicycle_path -from clock pin 1111 -to D pin 1192
    set_multicycle_path -from clock pin 1121 -to D pin 1192
    set_multicycle_path -from clock pin 1131 -to D pin 1192
    set_multicycle_path -from clock pin 1421 -to D pin 1192
    set_multicycle_path -from clock pin 1431 -to D pin 1192

Note that this method produces the same series of commands as the method of FIG. 16. These commands annotate all of the multicycle paths in the circuit. The annotated circuit is then passed to logic synthesis so that the logic can be optimized in step 160 of FIG. 3.

Chaining tables and multicycle constraints tightly couple the results of behavioral and logic synthesis. By using a timing verifier to create chaining tables, behavioral synthesis is able to produce better schedules than with previous methods. Furthermore, including control chaining information in the chaining tables allows behavioral synthesis to better compute the effects of control chaining operations in the scheduled circuit. Once the circuit has been scheduled, sending a list of multicycle constraints to the logic optimizer ensures that the logic optimizer correctly optimizes multicycle operations.

What is claimed is:

1. A method performed by a data processing system having a memory comprising the steps of:
    synthesizing a representation of a digital circuit in said memory;
    identifying an operation in said representation of said digital circuit;
    scheduling said operation within a clock cycle if an execution time of said operation is less than a time period for one clock cycle; and
    generating a multicycle constraint value for said operation if said execution time of said operation is more than said time period for one clock cycle, wherein said multicycle constraint value indicates said operation requires N cycles to execute and N is two or more.

2. The method of claim 1, further comprising the step of measuring in units of time smaller than said time period for one clock cycle, an execution time of said operation.

3. The method of claim 1, wherein the step of creating said multicycle constraint value further includes the steps of:
    identifying, in said representation of said digital circuit, a first register driving said multicycle operation;
    identifying, in said representation of said digital circuit, a second register driven by said multicycle operation; and
    annotating, in said representation of said digital circuit in the memory, a path between said first register and said second register as requiring N cycles.

4. The method of claim 2, further comprising the step of optimizing a technology mapping of said digital circuit according to said multicycle constraint.

5. A method performed by a data processing system having a memory, comprising the steps of:
    translating an input representation of a digital circuit in memory into a first representation comprising a first level and a second level, wherein the first level is a higher-level representation of the digital circuit than the second level;
    determining delay values for the first level by timing the second level; and
    scheduling the first level according to the delay values.

6. The method of claim 5, wherein the second level is a bit-level representation.

7. The method of claim 5, wherein the step of determining further comprises technology specific timing of the second level.

8. The method of claim 5, wherein the first level is comprised of a first and a second operation, each of which is represented by a plurality of elements at the second level, and wherein the first and second operations are scheduled in the step of scheduling.

9. The method of claim 5, wherein the step of determining comprises annotating a first table, uniquely associated with a first operation of the first level, with a first ready time of the first operation.

10. The method of claim 9, wherein the step of determining comprises setting the arrival time of an input of the second level, corresponding to an input of the first operation, to a predetermined value.

11. The method of claim 10, wherein the first table is a chaining table.

12. The method of claim 9, wherein the first table is a chaining table.

13. The method of claim 9, wherein the step of determining comprises:
    identifying a second operation of the first level in a transitive fanout of the first operation; and
    annotating the first table with a second ready time of the second operation.

14. The method of claim 13, wherein the first table is a chaining table.

15. The method of claim 9, wherein the step of determining comprises:
    identifying an activation condition, in a transitive fanout of the first operation, wherein the activation condition can cause a second operation to be activated;
    determining a second chained ready time of the second operation; and
    annotating the first table with the second chained ready time.

16. The method of claim 15, wherein the first table is a chaining table.

17. The method of claim 15, wherein the step of determining the second chained ready time comprises the steps of:
    setting a second arrival time of a second input of the second operation to a predetermined value;
    timing the second level to produce the second chained ready time; and
    annotating an output of the second operation with the second chained ready time.

18. The method of claim 15, wherein the step of determining the second chained ready time comprises the steps of:
    getting a second ready time of the second operation from a second table uniquely associated with the second operation; and
    adding the second ready time to the first operation ready time.

19. A system for building a digital circuit representation, the system having a processor coupled to a memory unit, said system comprising:

a circuit configured to parse a text description of a digital circuit into a parsed text description:

a circuit configured to translate the parsed text description into a first representation comprising a first level and a second level, wherein the first level is a higher-level representation of the digital circuit than the second level;

a circuit configured to determine delay values for the first level by timing the second level; and a circuit configured to schedule the first level according to the delay values.

20. The system of claim 19, wherein the circuit configured to determine annotates a first table, uniquely associated with a first operation of the first level, with a first ready time of the first operation.

21. The system of claim 20, wherein the first table is a chaining table.

22. The system of claim 19, wherein the second level is a bit-level representation.

23. The system of claim 19, wherein the circuit configured to determine further comprises circuitry for technology specific timing of the second level.

24. The system of claim 19, wherein the first level is comprised of a first and a second operation, each of which is represented by a plurality of elements at the second level, and wherein the first and second operations are scheduled by the scheduling circuitry.

25. The system of claim 20, wherein the circuit configured to determine comprises arrival time circuitry for setting the arrival time of an input of the second level, corresponding to an input of the first operation, to a predetermined value.

26. The system of claim 20, wherein the circuit configured to determine comprises:

a circuit configured to identify a second operation of the first level in a transitive fanout of the first operation; and a circuit configured to annotate the first chaining table with a second ready time of the second operation.

27. The system of claim 26, wherein the first table is a chaining table.

28. The system of claim 20, wherein the circuit configured to determine comprises:

a circuit configured to identify an activation condition, in a transitive fanout of the first operation, the activation condition causing a second operation of the first level to be activated;

a circuit configured to determine a second chained ready time of the second operation; and a circuit configured to annotate the first table with the second chained ready time.

29. The system of claim 28, wherein the circuit configured to determine the second chained ready time comprises:

a circuit configured to set a second arrival time of a second input of the second operation to a predetermined value;

a circuit configured to time the second representation to produce the second chained ready time; and a circuit configured to annotate an output of the second operation with the second chained ready time.

30. The system of claim 28, wherein the circuit configured to determine a second chained ready time comprises:

a circuit configured to get a second ready time of the second operation from a second table uniquely associated with the second operation; and a circuit configured to add the second ready time to the first operation ready time.

31. The system of claim 28, wherein the first table is a chaining table.

32. The system of claim 25, wherein the first table is a chaining table.

* * * * *